US007859436B2

(12) United States Patent
Werner et al.

(10) Patent No.: US 7,859,436 B2
(45) Date of Patent: Dec. 28, 2010

(54) MEMORY DEVICE RECEIVER

(75) Inventors: Carl Werner, Los Gatos, CA (US);
Mark Horowitz, Menlo Park, CA (US);
Pak Chau, San Jose, CA (US); Scott Best, Palo Alto, CA (US); Stefanos Sidiropoulos, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 100 days.

(21) Appl. No.: 12/258,285

(22) Filed: Oct. 24, 2008

(65) Prior Publication Data
US 2009/0097338 A1     Apr. 16, 2009

Related U.S. Application Data

(63) Continuation of application No. 11/393,104, filed on Mar. 29, 2006, now Pat. No. 7,456,778, which is a continuation of application No. 10/903,572, filed on Jul. 30, 2004, now Pat. No. 7,093,145, which is a continuation of application No. 09/655,010, filed on Sep. 5, 2000, now Pat. No. 6,772,351, which is a continuation-in-part of application No. 09/478,916, filed on Jan. 6, 2000, now Pat. No. 7,124,221.

(60) Provisional application No. 60/158,189, filed on Oct. 19, 1999.

(51) Int. Cl.
*H03M 7/00* (2006.01)
(52) U.S. Cl. .................... 341/89; 341/50; 341/51
(58) Field of Classification Search .................. 341/50, 341/51, 89; 365/226
See application file for complete search history.

(56) References Cited

U.S. PATENT DOCUMENTS

| 2,732,431 A | 1/1956 | Boughtwood |
| 2,912,684 A | 11/1959 | Steele |
| 3,051,901 A | 8/1962 | Yaeger |
| 3,078,378 A | 2/1963 | Burley et al. |

(Continued)

FOREIGN PATENT DOCUMENTS

DE        4320930        1/1995

(Continued)

OTHER PUBLICATIONS

Allen, A.O., "Probability, Statistics, and Queueing Theory with Computer Science Applications," 2nd Edition, CH 7, pp. 450, 458-459.

(Continued)

*Primary Examiner*—Jean B Jeanglaude
(74) *Attorney, Agent, or Firm*—Morgan, Lewis & Bockius LLP

(57) ABSTRACT

A memory device includes a receiver to receive a first input data signal and to create an output signal corresponding to the first input data signal and a voltage representative of a second signal received earlier in time than the first input data signal. A memory system includes a memory controller and one or more memory devices, at least one or which includes a receiver to receive a first input data signal and to create an output signal corresponding to the first input data signal and a voltage representative of a second signal received earlier in time than the first input data signal.

10 Claims, 20 Drawing Sheets

U.S. PATENT DOCUMENTS

| | | |
|---|---|---|
| 3,267,459 A | 8/1966 | Chomicki et al. |
| 3,381,245 A | 4/1968 | Guanella |
| 3,484,559 A | 12/1969 | Rigby |
| 3,508,076 A | 4/1970 | Winder |
| 3,510,585 A | 5/1970 | Stone |
| 3,560,856 A | 2/1971 | Kaneko |
| 3,569,955 A | 3/1971 | Maniere |
| 3,571,725 A | 3/1971 | Kaneko et al. |
| 3,587,088 A | 6/1971 | Franaszek |
| 3,648,064 A | 3/1972 | Mukai et al. |
| 3,697,874 A | 10/1972 | Kaneko |
| 3,723,892 A | 3/1973 | Julie |
| 3,731,199 A | 5/1973 | Tazaki et al. |
| 3,733,550 A | 5/1973 | Tazaki et al. |
| 3,753,113 A | 8/1973 | Maruta et al. |
| 3,754,237 A | 8/1973 | de Laage de Meux |
| 3,761,818 A | 9/1973 | Tazaki et al. |
| 3,772,680 A | 11/1973 | Kawai et al. |
| 3,798,544 A | 3/1974 | Norman |
| 3,832,490 A | 8/1974 | Leonard |
| 3,860,871 A | 1/1975 | Hinoshita et al. |
| 3,876,944 A | 4/1975 | Mack et al. |
| 3,927,401 A | 12/1975 | McIntosh |
| 3,978,284 A | 8/1976 | Yoshino et al. |
| 3,988,676 A | 10/1976 | Whang |
| 4,038,564 A | 7/1977 | Hakata |
| 4,070,650 A | 1/1978 | Ohashi et al. |
| 4,086,587 A | 4/1978 | Lender |
| 4,097,859 A | 6/1978 | Looschen |
| 4,131,761 A | 12/1978 | Giusto |
| RE30,182 E | 12/1979 | Howson |
| 4,181,865 A | 1/1980 | Kohyama |
| 4,280,221 A | 7/1981 | Chun et al. |
| 4,373,152 A | 2/1983 | Jacobsthal |
| 4,382,249 A | 5/1983 | Jacobsthal |
| 4,398,287 A | 8/1983 | Spencer |
| 4,403,330 A | 9/1983 | Meyer |
| 4,408,135 A | 10/1983 | Yuyama et al. |
| 4,408,189 A | 10/1983 | Betts et al. |
| 4,438,491 A | 3/1984 | Constant |
| 4,481,625 A | 11/1984 | Roberts et al. |
| 4,528,550 A | 7/1985 | Graves et al. |
| 4,571,735 A | 2/1986 | Furse |
| 4,602,374 A | 7/1986 | Nakamura et al. |
| 4,620,188 A | 10/1986 | Sengchanh |
| 4,628,297 A | 12/1986 | Mita et al. |
| 4,748,637 A | 5/1988 | Bishop et al. |
| 4,779,073 A | 10/1988 | Iketani |
| 4,805,190 A | 2/1989 | Jaffre et al. |
| 4,821,286 A | 4/1989 | Graczyk et al. |
| 4,823,028 A | 4/1989 | Lloyd |
| 4,825,450 A | 4/1989 | Herzog |
| 4,841,301 A | 6/1989 | Ichihara |
| 4,860,309 A | 8/1989 | Costello |
| 4,875,049 A | 10/1989 | Yoshida |
| 4,888,764 A | 12/1989 | Haug |
| 5,003,555 A | 3/1991 | Bergmans |
| 5,023,488 A | 6/1991 | Gunning |
| 5,023,841 A | 6/1991 | Akrout et al. |
| 5,045,728 A | 9/1991 | Crafts |
| 5,046,050 A | 9/1991 | Kertis |
| 5,115,450 A | 5/1992 | Arcuri |
| 5,121,411 A | 6/1992 | Fluharty |
| 5,126,974 A | 6/1992 | Sasaki et al. |
| 5,153,459 A | 10/1992 | Park et al. |
| 5,172,338 A | 12/1992 | Mehrotra et al. |
| 5,191,330 A | 3/1993 | Fisher et al. |
| 5,194,765 A | 3/1993 | Dunlop et al. |
| 5,230,008 A | 7/1993 | Duch et al. |
| 5,243,625 A | 9/1993 | Verbakel et al. |
| 5,254,883 A | 10/1993 | Horowitz et al. |
| 5,259,002 A | 11/1993 | Carlstedt |
| 5,280,500 A | 1/1994 | Mazzola et al. |
| 5,287,108 A | 2/1994 | Mayes et al. |
| 5,295,155 A | 3/1994 | Gersbach et al. |
| 5,295,157 A | 3/1994 | Suzuki et al. |
| 5,315,175 A | 5/1994 | Langner |
| 5,331,320 A | 7/1994 | Cideciyan et al. |
| 5,373,473 A | 12/1994 | Okumura |
| 5,408,498 A | 4/1995 | Yoshida |
| 5,412,689 A | 5/1995 | Chan et al. |
| 5,425,056 A | 6/1995 | Maroun et al. |
| 5,426,739 A | 6/1995 | Lin et al. |
| 5,438,593 A | 8/1995 | Karam et al. |
| 5,459,749 A | 10/1995 | Park |
| 5,471,156 A | 11/1995 | Kim et al. |
| 5,473,635 A | 12/1995 | Chevroulet |
| 5,483,110 A | 1/1996 | Koide et al. |
| 5,508,570 A | 4/1996 | Laber et al. |
| 5,513,327 A | 4/1996 | Farmwald et al. |
| 5,525,983 A | 6/1996 | Patel et al. |
| 5,534,795 A | 7/1996 | Wert et al. |
| 5,534,798 A | 7/1996 | Phillips et al. |
| 5,539,774 A | 7/1996 | Nobakht et al. |
| 5,546,042 A | 8/1996 | Tedrow et al. |
| 5,553,097 A | 9/1996 | Dagher |
| 5,568,045 A | 10/1996 | Koazechi |
| 5,585,749 A | 12/1996 | Pace et al. |
| 5,596,439 A | 1/1997 | Dankberg et al. |
| 5,604,468 A | 2/1997 | Gillig |
| 5,604,605 A | 2/1997 | Moolenaar |
| 5,608,755 A | 3/1997 | Rakib |
| 5,633,631 A | 5/1997 | Teckman |
| 5,640,605 A | 6/1997 | Johnson et al. |
| 5,644,253 A | 7/1997 | Takatsu |
| 5,663,663 A | 9/1997 | Cao et al. |
| 5,684,833 A | 11/1997 | Watanabe |
| 5,694,424 A | 12/1997 | Ariyavisitakul |
| 5,734,294 A | 3/1998 | Bezzam et al. |
| 5,740,201 A | 4/1998 | Hui |
| 5,742,591 A | 4/1998 | Himayat et al. |
| 5,751,168 A | 5/1998 | Speed, III et al. |
| 5,757,712 A | 5/1998 | Nagel et al. |
| 5,761,246 A | 6/1998 | Cao et al. |
| 5,793,815 A | 8/1998 | Goodnow et al. |
| 5,793,816 A | 8/1998 | Hui |
| 5,796,781 A | 8/1998 | DeAndrea et al. |
| 5,798,918 A | 8/1998 | Georgiou et al. |
| 5,809,033 A | 9/1998 | Turner et al. |
| 5,825,825 A | 10/1998 | Altmann et al. |
| 5,852,637 A | 12/1998 | Brown et al. |
| 5,864,584 A | 1/1999 | Cao et al. |
| 5,867,010 A | 2/1999 | Hinedi et al. |
| 5,872,468 A | 2/1999 | Dyke |
| 5,887,032 A | 3/1999 | Cioffi |
| 5,892,466 A | 4/1999 | Walker |
| 5,898,634 A * | 4/1999 | Chevallier .................. 365/226 |
| 5,898,734 A | 4/1999 | Nakamura et al. |
| 5,917,340 A | 6/1999 | Manohar et al. |
| 5,917,856 A | 6/1999 | Torsti |
| 5,933,458 A | 8/1999 | Leurent et al. |
| 5,942,994 A | 8/1999 | Lewiner et al. |
| 5,946,355 A | 8/1999 | Baker |
| 5,949,280 A | 9/1999 | Sasaki |
| 5,969,579 A | 10/1999 | Hartke et al. |
| 5,969,648 A | 10/1999 | Garnett |
| 5,970,088 A | 10/1999 | Chen |
| 5,973,508 A | 10/1999 | Nowak et al. |
| 5,977,798 A | 11/1999 | Zerbe |
| 5,982,741 A | 11/1999 | Ethier |
| 5,986,472 A | 11/1999 | Hinedi et al. |
| 6,005,895 A | 12/1999 | Perino et al. |
| 6,006,169 A | 12/1999 | Sandhu et al. |
| 6,009,120 A | 12/1999 | Nobakht |

| | | | |
|---|---|---|---|
| 6,018,550 A | 1/2000 | Emma et al. | |
| 6,034,993 A | 3/2000 | Norrell et al. | |
| 6,037,824 A | 3/2000 | Takahashi | |
| 6,038,260 A | 3/2000 | Emma et al. | |
| 6,038,264 A | 3/2000 | Useugi | |
| 6,048,931 A | 4/2000 | Fujita et al. | |
| 6,049,229 A | 4/2000 | Manohar et al. | |
| 6,052,390 A | 4/2000 | Deliot et al. | |
| 6,061,395 A | 5/2000 | Tonami | |
| 6,067,326 A | 5/2000 | Johsson et al. | |
| 6,069,577 A | 5/2000 | Morisson et al. | |
| 6,078,627 A | 6/2000 | Crayford | |
| 6,084,931 A | 7/2000 | Powell, II et al. | |
| 6,088,400 A | 7/2000 | Abe | |
| 6,094,075 A | 7/2000 | Garrett | |
| 6,094,461 A | 7/2000 | Heron | |
| 6,097,215 A | 8/2000 | Bialas, Jr. et al. | |
| 6,100,713 A | 8/2000 | Kalb et al. | |
| 6,101,561 A | 8/2000 | Beers et al. | |
| 6,114,979 A | 9/2000 | Kim | |
| 6,122,010 A | 9/2000 | Emelko | |
| 6,140,841 A | 10/2000 | Suh | |
| 6,160,421 A | 12/2000 | Barna | |
| 6,181,740 B1 | 1/2001 | Yasuda | |
| 6,195,397 B1 | 2/2001 | Kwon | |
| 6,204,785 B1 | 3/2001 | Fattaruso et al. | |
| 6,215,635 B1 | 4/2001 | Nguyen | |
| 6,222,380 B1 | 4/2001 | Gerowitz et al. | |
| 6,262,611 B1 | 7/2001 | Takeuchi | |
| 6,275,540 B1 | 8/2001 | Barrett, Jr. et al. | |
| 6,282,184 B1 | 8/2001 | Lehman et al. | |
| 6,289,045 B1 | 9/2001 | Hasegawa et al. | |
| 6,307,824 B1 | 10/2001 | Kuroda et al. | |
| 6,307,906 B1 | 10/2001 | Tanji et al. | |
| 6,373,911 B1 | 4/2002 | Tajima et al. | |
| 6,396,329 B1 | 5/2002 | Zerbe | |
| 6,397,408 B1 | 6/2002 | Veloskey et al. | |
| 6,560,293 B1 | 5/2003 | Alelyunas et al. | |
| 6,772,351 B1 | 8/2004 | Werner et al. | |
| 6,965,262 B2 | 11/2005 | Zerbe | |
| 7,072,415 B2 | 7/2006 | Zerbe et al. | |
| 7,093,145 B2 | 8/2006 | Werner et al. | |
| 7,124,221 B1 | 10/2006 | Zerbe et al. | |
| 7,161,513 B2 | 1/2007 | Werner et al. | |
| 2001/0010712 A1 | 8/2001 | Hedberg | |
| 2001/0016929 A1 | 8/2001 | Bonneau et al. | |
| 2001/0019584 A1 | 9/2001 | Azazzi et al. | |
| 2001/0021987 A1 | 9/2001 | Govindarajan et al. | |

FOREIGN PATENT DOCUMENTS

| | | | |
|---|---|---|---|
| EP | 0094624 | | 11/1983 |
| EP | 0352869 | A2 | 7/1989 |
| EP | 0463316 | A1 | 1/1992 |
| EP | 0482392 | A2 | 4/1992 |
| EP | 0490504 | A2 | 6/1992 |
| JP | 54051343 | | 4/1979 |
| JP | 56168711 | | 10/1981 |
| JP | 56164650 | | 12/1981 |
| JP | 58/54412 | A | 3/1983 |
| JP | 59036465 | | 2/1984 |
| JP | 60087551 | | 5/1985 |
| JP | 60191231 | | 8/1985 |
| JP | 60194647 | | 10/1985 |
| JP | 02128201 | | 5/1990 |
| JP | 02140676 | | 5/1990 |
| JP | 04044691 | | 2/1992 |
| JP | 05143211 | | 6/1993 |
| JP | 08202677 | | 8/1996 |
| JP | 08286943 | | 11/1996 |
| JP | 09181778 | | 7/1997 |
| JP | 10200345 | A | 7/1998 |
| WO | WO 95/31867 | | 11/1995 |
| WO | WO 96/31038 | | 10/1996 |
| WO | WO 98/33306 | | 7/1998 |
| WO | WO 99/10982 | | 3/1999 |

OTHER PUBLICATIONS

Ariyavisitakul, S., "Reduced-Complexity Equalization Techniques for broadband wireless Channels," IEEE Journal on Selected Areas in Communications, 15(1), pp. 5-15, 1997.

Ariyavisitakul, S., et al., "Tap-Selectable Decision-Feedback Equalization," IEEE Transactions on Communications, vol. 45(12), pp. 1497-1500, 1997.

Azdet, K., et al., "A Gigabit Transceiver Chip Set for UTP CAT-6 Cables in Digital CMOS Technology," IEEE International Solid State Circuits Conference, pp. 306-307, 2000.

Bazes, M., "Two Novel Fully complementary Self-Biased CMOS Differential Amplifiers," IEEE Journal of Solid State Circuits, vol. 26, No. 2, Feb. 1991.

Chappell, T.I., et al., "A 2ns Cycle, 4ns Access 512 kb CMOS ECL SRAM," IEEE International Solid State Circuits Conference 1991.

Cova, S.D., et al., "Characterization of Individual Weights in Transversal Filters and Application to CCD's," IEEE Journal of Solid State Circuits, SC17(6), pp. 1054-1061, 1982.

Current, "Current-mode CMOS multiple-valued logic circuits," IEEE Journal of Solid-State Circuits 29(2):95-107, 1994.

Dally, W.J., et al., "Digital Systems Engineering," Cambridge University Press, New York, NY, 1998, pp. 344-347 and 352.

Dally, W.J., et al., "Multi-gigabit Signaling with CMOS," DARPA funded presentation, May 1997.

Donnelly, K.S., et al., "A 660 MB/s Interface Megacell Portable Circuit in 0.3 μm-0.7 μm CMOS ASIC," IEEE Journal of Solid State Circuits, vol. 31, No. 12, Dec. 1996.

Farjad-Rad, R., et al., "A 0.4-um CMOS 10-Gb/s 4-PAM pre-emphasis serial link transmitter," IEEE J. Solid-State Circuits, vol. No. 34, pp. 580-585, May 1999.

Farjad-Rad, et al., "An equalization scheme for 10Gb/s 4-PAM signaling over long cables," Presentation. Center for Integrated Systems, Department of Electrical Engineering, Stanford University, Jul. 28, 1997.

Fiedler, A., et al., "A 1.0625Gbps Transceiver with 2x-Oversampling and Transmit Signal Pre-Emphasis," IEEE/ISSCC, Feb. 1997.

IBM Technical Disclosure Bulletin, Apr. 1, 1993, "Servo Control of Analog Power Supplies Purpose Interface Card," vol. 36, Issue 4, pp. 283-286,.

IBM Technical Disclosure Bulletin, Jun. 1967, "Use of multibit encoding to increase linear recording densities in serially recorded records," pp. 14-15.

IBM Technical Disclosure Bulletin, Jan. 1968, "Coding data transmission," pp. 1295-1296.

IBM Technical Disclosure Bulletin, Jul. 1969, "Clock recovery circuit," pp. 219-220.

IBM Technical Disclosure Bulletin, Nov. 1970, "Transmission by data encoding," pp. 1519-1520.

IBM Technical Disclosure Bulletin, Feb. 1976, "Bidirectional communications within a binary switching system," pp. 2865-2866.

IBM Technical Disclosure Bulletin, Feb. 1976, "Multilevel bidirectional signal transmission," pp. 2867-2868.

IBM Technical Disclosure Bulletin, Oct. 1978, "Multilevel signal transfers," pp. 1798-1800.

IBM Technical Disclosure Bulletin, Feb. 1981, "Circuit for multilevel logic implementation," pp. 4206-4209.

IBM Technical Disclosure Bulletin, Apr. 1983, "Multi level logic testing," pp. 5903-5904.

IBM Technical Disclosure Bulletin, Sep. 1985, "Push-pull multilevel driver circuit for input-output bus," pp. 1649-1651.

IBM Technical Disclosure Bulletin, Aug. 1986, "Multilevel CMOS sense amplifier," pp. 1280-1281.

IBM Technical Disclosure Bulletin, Nov. 1992, "Multi-level encoded high bandwidth bus," pp. 444-447.

IBM Technical Disclosure Bulletin, Feb 1995, "High speed complimentary metal oxide semiconductor input/output circuits," pp. 111-114.

IBM Technical Disclosure Bulletin, Apr. 1995, "Common front end bus for high-performance chip-to-chip communication," pp. 443-444.

IBM Technical Disclosure Bulletin, Apr. 1995, "High performance impedance controlled CMOS Drive," pp. 445-448.

IBM Technical Disclosure Bulletin, Apr. 1995, "3-state decoder for external 3-state buffer," pp. 477-478.

IBM Technical Disclosure Bulletin, Apr. 1990, "Propagation Over Multiple Parallel Transmission Lines Via Modes,"). pp. 1-6.

IEEE - 802.3ab—A Tutorial Presentation, Mar. 1998.

IEEE - P802.3ad-Draft Supplement to Carrier Sense Multiple Access with Collision Detection (CSMA/CD) Access Method & Physical Layer Specifications: Link Aggregation, 1999.

Ishibe, M., et al., "High-Speed CMOS I/O Buffer Circuits," IEEE Journal of Solid State Circuits, vol. 27, No. 4, Apr. 1992.

Kobayashi, T., et al., "A current-controlled latch sense amplifier and a static power-saving input buffer for low-pressure architecture," IEEE Journal of Solid State Circuits vol. 28 No. 4., Apr. 1993.

Kuczynski, M.A., et al., "A 1Mb/s Digital Subscriber Line Transceiver Signal Processor," IEEE Digital and Video Signal Processing/ISSCC, pp. 26-32, 1999.

Lau, B. et al., "A 2.6-Gbyte/s multipurpose chip-to-chip interface," IEEE J. Solid-State Circuits, vol. 33, pp. 1617-1626, Nov. 1998.

Lee, J., et al., "A 80ns 5v-Only Dynamic RAM," ISSCC Proceedings, Paper 12.2, 1979.

Matick, "Transmission Lines for Digital and Communication Networks: An Introduction to Transmission Lines, High-frequency and High-speed Pulse Characteristics and Applications," IEEE Press, New York, NY, 1995, pp. 268-269.

Moncayo, A., et al., "Bus design and analysis at 500MHz and beyond," Presented at the Design SuperCon, 1995.

Perez-Alvarez, I.A., et al., "A Differential Error Reference Adaptive Echo Canceller for Multilevel PAM Line Codes," IEEE, pp. 1707-1710, 1996.

Pilo, H., et al., "A 300 MHz 3.3V 1 Mb SRAM Fabricated in a 0.5 μm CMOS Process," IEEE International Solid State Circuits Conference 1996.

Portmann, C., et al., "A multiple vendor 2.5-V DLL for 1.6-GB/s RDRAMs," IEEE VLSI Circuits Symposium, Jun. 1999.

Raghavan, S.A., et al., "Nonuniformly Spaced Tapped-Delay-Line Equalizers," (1993), IEEE Transactions on Communications, 41(9), pp. 1290-1295, (1993).

Schumacher, H.J., et al., "CMOS Subnanosecond True-ECL Output Buffer," IEEE Journal of Solid-State Circuits, vol. 25, No. 1, Feb. 1990.

Scott, "Propagation Over Multiple Parallel Transmission Lines Via Modes," IBM Technical Disclosure Bulletin, U.S., vol. 32, No. 11, Apr. 1990.

Seki, T., et al., "A 6-ns 1-Mb CMOS SRAM with Latched Sense Amplifier," IEEE Journal of Solid State Circuits, vol. 28, No. 4, Apr. 1993.

Sidiropoulos, S., et al.; "A 700-Mb/s/pin CMOS Signaling Interface Using Current Integrating Receivers"; IEEE Journal of Solid-State Circuits; vol. 32, No. 5, May 1997.

Sidiropoulos, S., et al., "A 700 Mb/s/pin CMOS Signaling Interface Using Current Integrating Receivers," IEEE VLSI Circuits Symposium, 1996.

Singh, "Four valued buses for clocked CMOS VLSI systems," Proceedings of the Seventeenth International Symposium on Multiple-Valued Logic, The Computer Society of the IEEE. Boston, Massachusetts, May 26-28, 1987, pp. 128-133.

Smith, "The prospects for multivalued logic: A technology and applications view," IEEE Transactions on Computers C-30(9):619-634, 1981.

Taborek, "Multi-Level Analog Signaling Techniques for 10 Gigabit Ethernet," IEEE, 802.3 Tutorial.

Thirion, "10 Gig PMD Technologies," IEEE Plenary, Kauai, Hawaii, Nov. 1999.

Thompson, G., "How 1000BASE-T Works," Presentation at IEEE 802.3 Plenary Session, 1997.

Tomasini, L., et. al., "A fully differential CMOS line driver for ISDN," IEEE Journal of Solid State Circuits, vol. 25, No. 2., Apr. 1990.

Vranesic, "Multivalued signaling in daisy chain bus control," Proceedings of the Ninth International Symposium on Multiple-Valued Logic, Bath, England, pp. 14-18, 1979.

Yang, T.S., al., "A 4-ns 4Kx1-bit Two-Port BiCMOS SRAM," IEEE Journal of D-State Circuits; vol. 23, No. 5; Oct. 1988.

Yang, K., et al., "A Scalable 32Gb/s Parallel Data Transceiver with On-Chip Timing Calibration Circuits," IEEE International Solid State Circuits Conference, pp. 258-259, 2000.

Yeung, E., et al., "A 2.4Gbps per pin simultaneous bidirectional parallel link with per pin skew calibration," ISSCC 2000, in press as of Jan. 9, 2000.

"4 Modulation Schemes for High Bit Rate Data Transmission in the Loop Plant," (Apr. 19, 2001), www.bib.frilippe.de/voltext/dipl/schlegd/chapter4.htm.

* cited by examiner

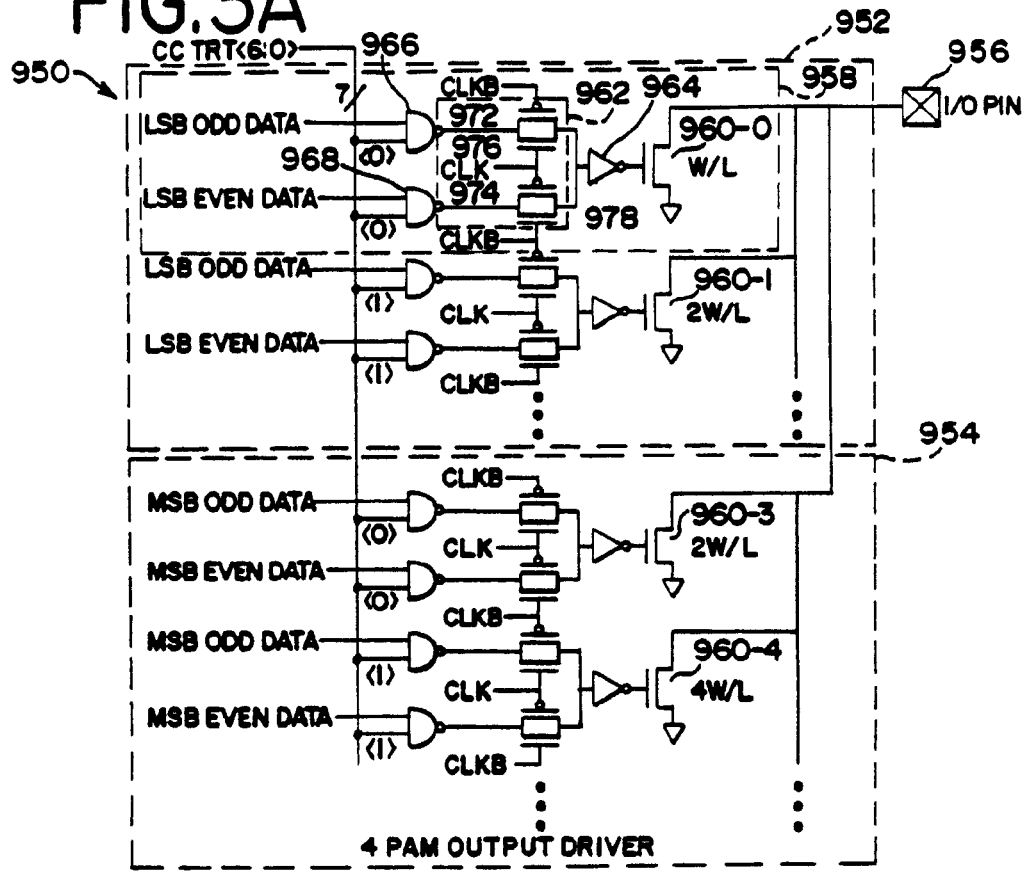
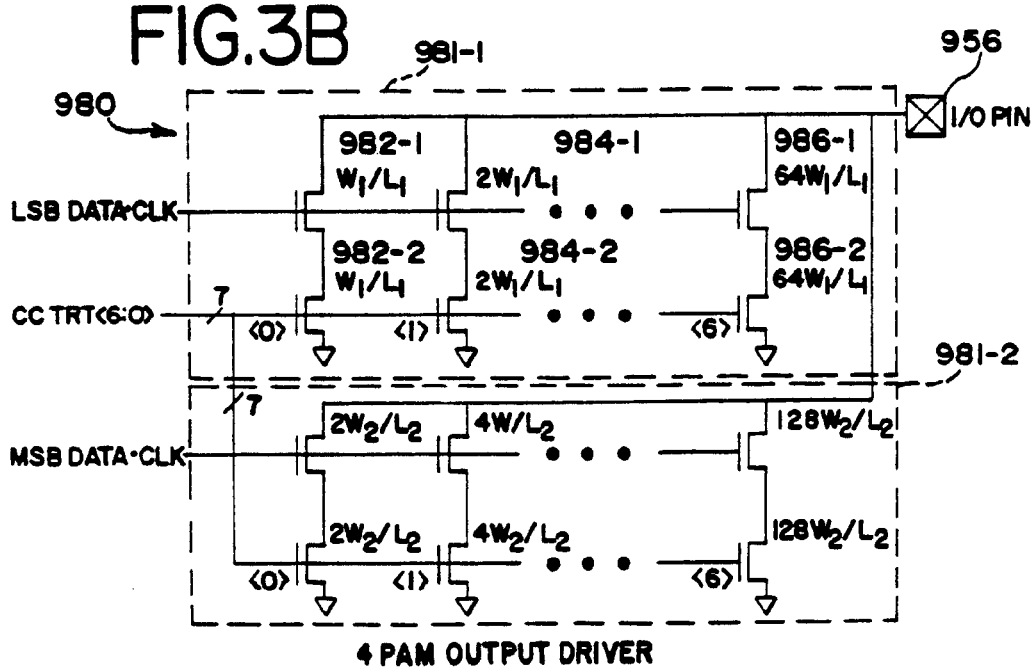

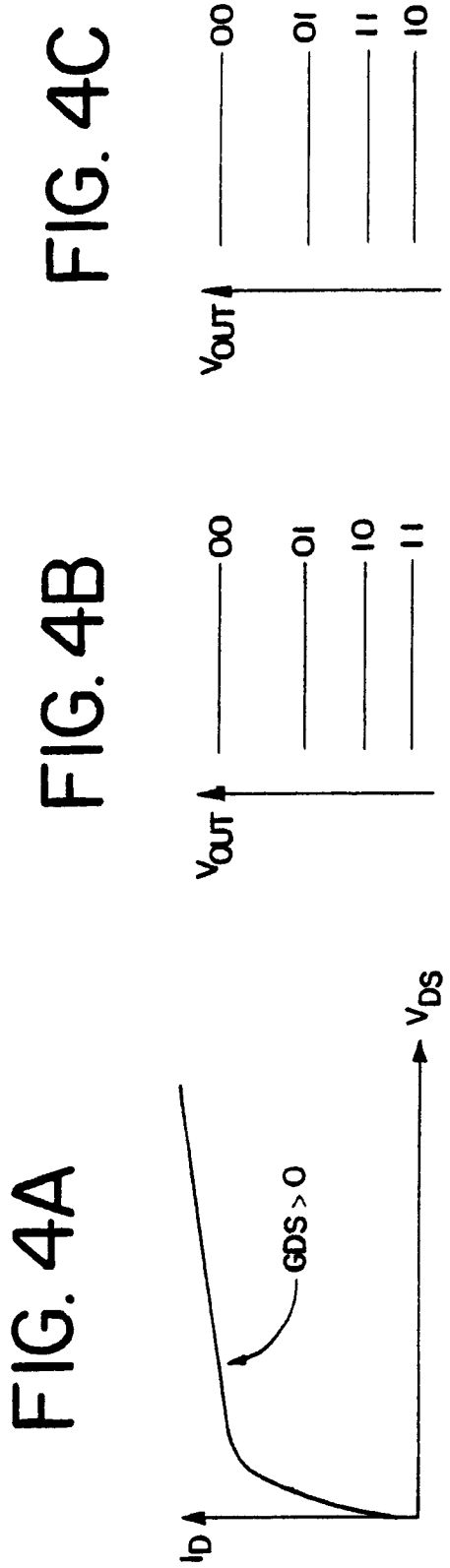

CIRCUIT TO REDUCE SWITCHING NOISE

GDS COMPENSATED MULTI-PAM OUTPUT DRIVER

☐ DATA MUXED BEFORE PAD

☐ REQUIRES RUNNING CMOS SIGNAL A,B,C @ FULL FREQUENCY

CIRCUIT FOR CALIBRATING THE GDS COMPENSATED OUTPUT DRIVER WITH CURRENT CONTROL

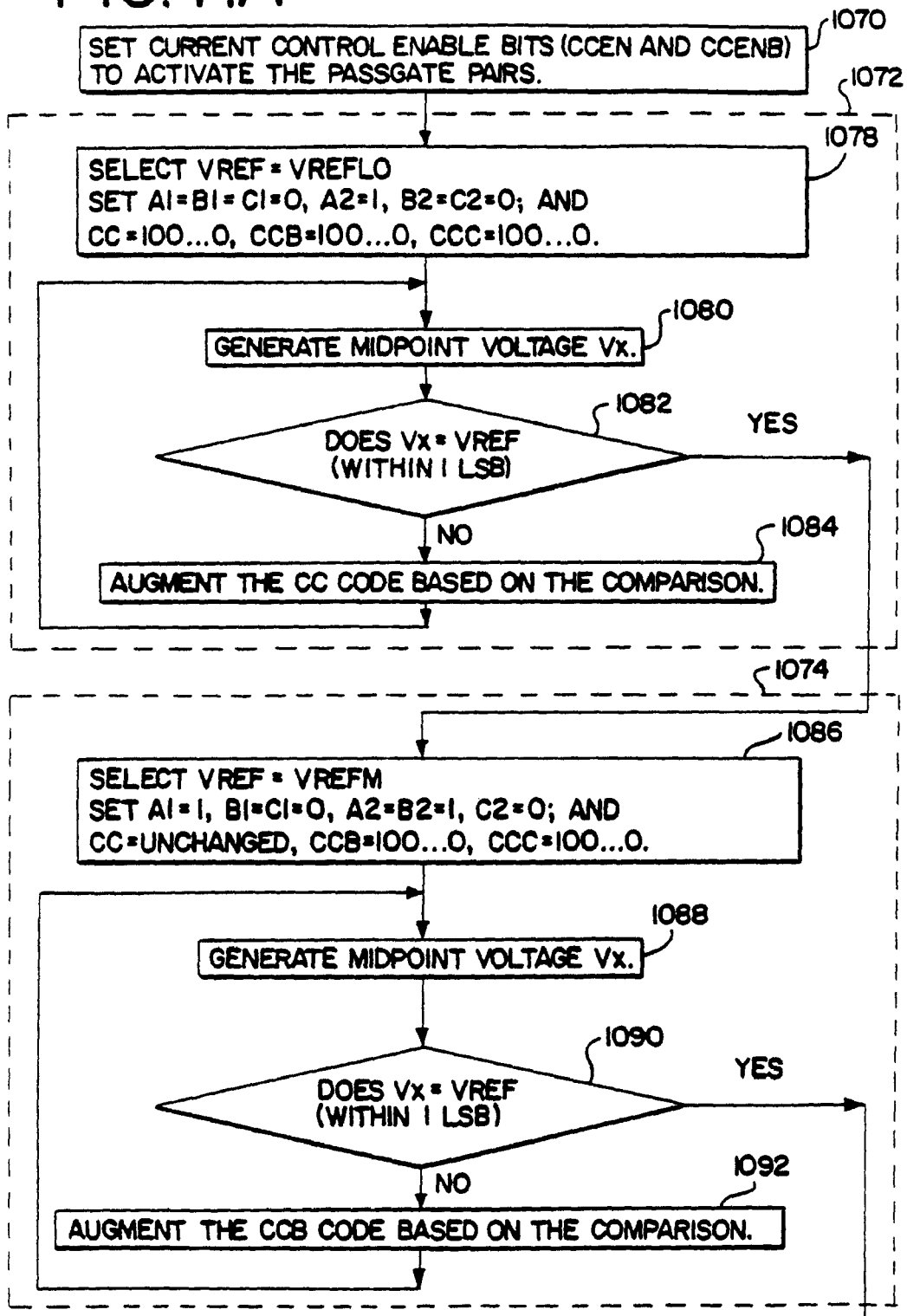

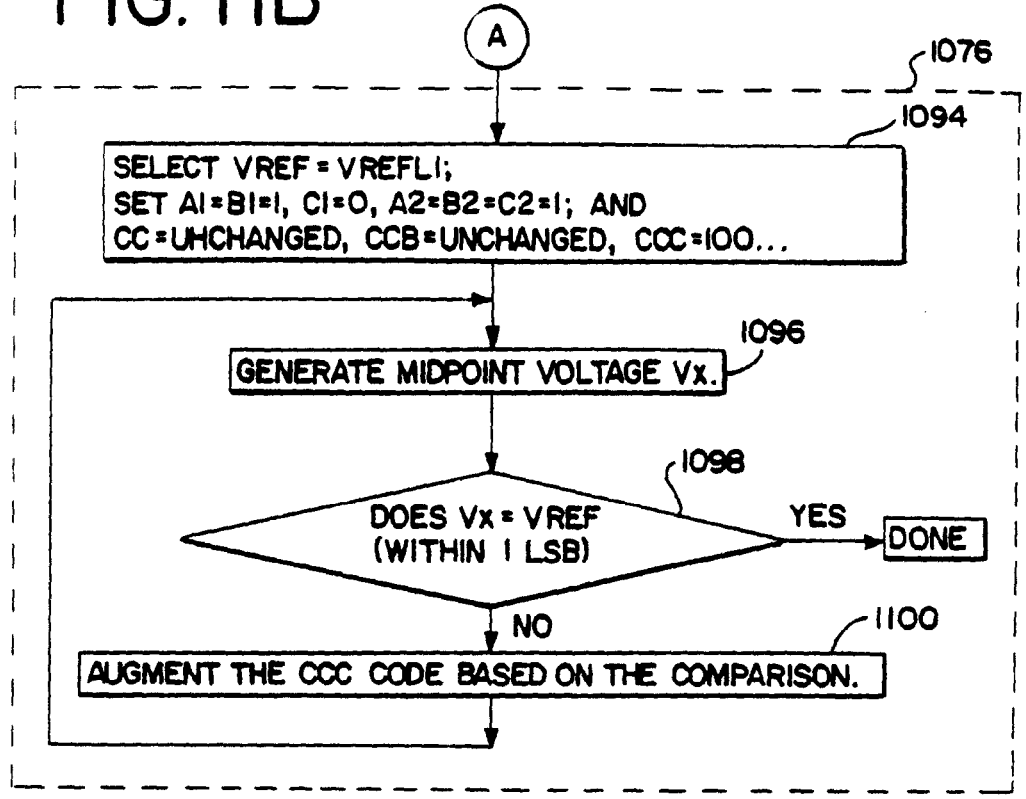
METHOD FOR CALIBRATING THE GDS COMPENSATED OUTPUT DRIVER WITH CURRENT CONTROL
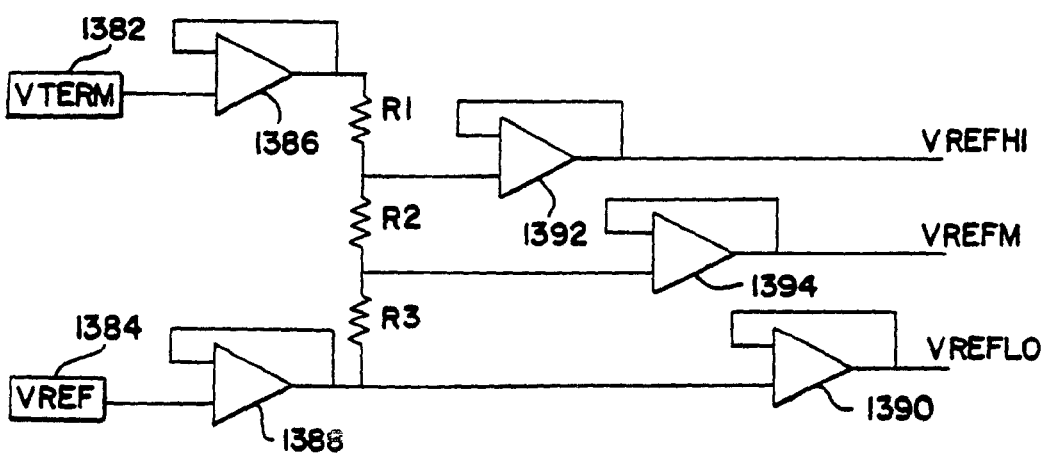

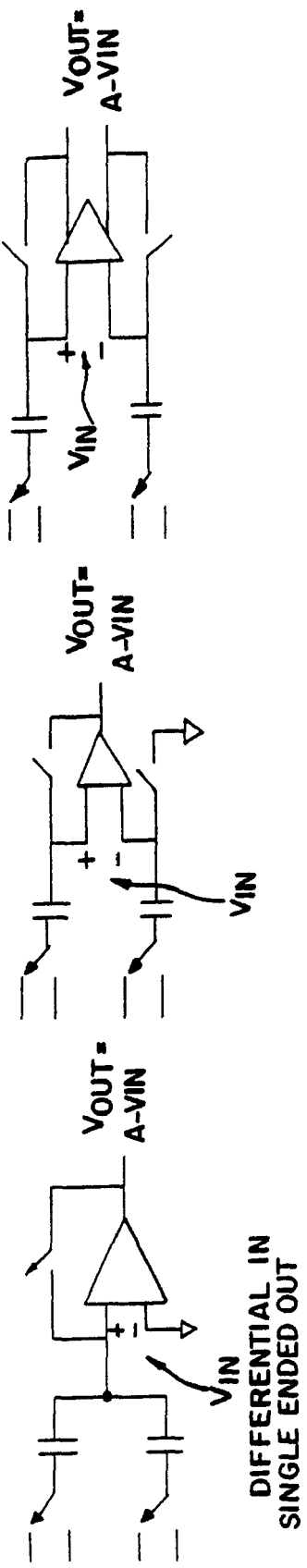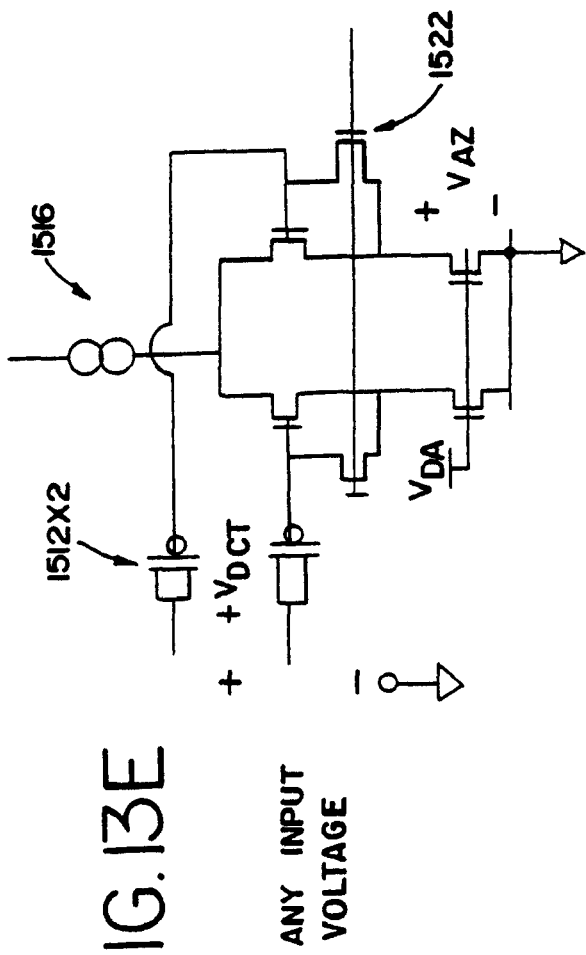
FIG.13D DIFFERENTIAL IN SINGLE ENDED OUT
FIG.13E ANY INPUT VOLTAGE

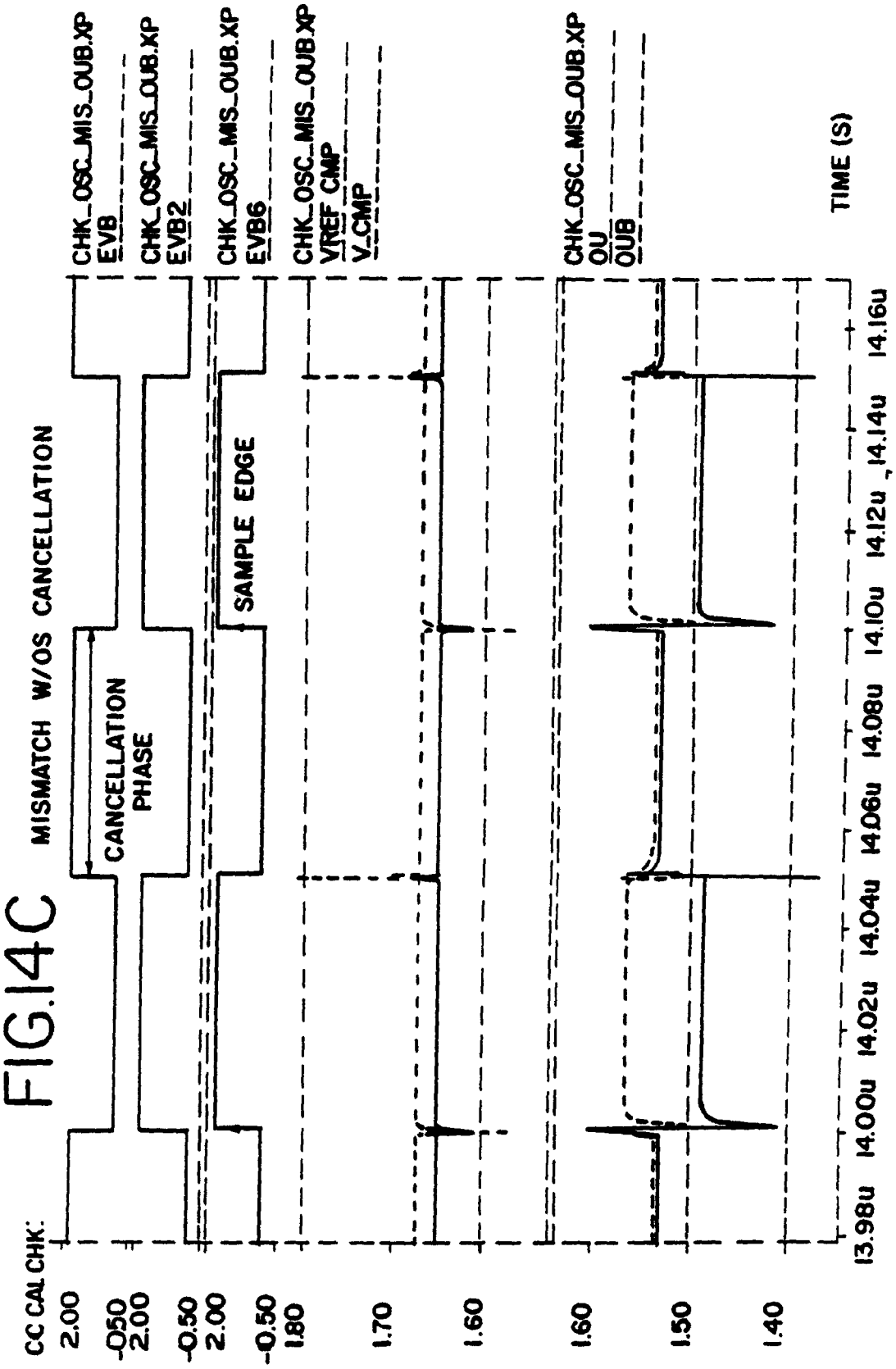
FIG.14C MISMATCH W/OS CANCELLATION

MEMORY DEVICE RECEIVER

CROSS REFERENCE TO RELATED APPLICATION(S)

This application is a continuation of U.S. patent application Ser. No. 11/393,104, filed Mar. 29, 2006, now U.S. Pat. No. 7,456,778 which is a continuation of U.S. patent application Ser. No. 10/903,572, filed Jul. 30, 2004, now U.S. Pat. No. 7,093,145, issued Aug. 15, 2006, which is continuation of U.S. patent application Ser. No. 09/655,010, filed Sep. 5, 2000, now U.S. Pat. No. 6,772,351, issued Aug. 3, 2004, which is a continuation-in-part of U.S. patent application Ser. No. 09/478,916, filed on Jan. 6, 2000, now U.S. Pat. No. 7,124,221, issued Oct. 17, 2006, which claims priority to U.S. Provisional Patent Application Ser. No. 60/158,189, entitled, filed on Oct. 19, 1999, the contents of each of which are incorporated herein by reference in their entirety.

FIELD OF THE INVENTION

The present invention relates generally to the field of electrical buses. More particularly, the present invention relates to a current driver for a high speed bus.

BACKGROUND OF THE INVENTION

Computer systems and other electronic systems typically use buses for interconnecting integrated circuit components so that the components may communicate with one another. The buses frequently connect a master, such as a microprocessor or controller, to slaves, such as memories and bus transceivers. Generally, a master may send data to and receive data from one or more slaves. A slave may send data to and receive data from a master, but not another slave.

Each master and slave coupled to a prior bus typically includes output driver circuitry for driving signals onto the bus. Some prior bus systems have output drivers that use transistor-transistor logic ("TTL") circuitry. Other prior bus systems have output drivers that include emitter-coupled logic ("ECL") circuitry. Other output drivers use complementary metal-oxide-semiconductor ("CMOS") circuitry or N-channel metal-oxide-semiconductor ("NMOS") circuitry.

While many prior buses were driven by voltage level signals, it has become advantageous to provide buses that are driven by a current mode output driver. A benefit associated with a current mode driver is a reduction of peak switching current. In particular, the current mode driver draws a known current regardless of load and operating conditions. A further benefit is that the current mode driver typically suppresses noise coupled form power and ground supplies.

A known current mode driver is shown in U.S. Pat. No. 5,254,883 (the "'883 patent"), which is assigned to the assignee of the present invention and incorporated herein by reference. The '883 patent discusses an apparatus and method for setting and maintaining the operating current of a current mode driver. The driver in the '883 patent includes an output transistor array, output logic circuitry coupled to the transistor array and a current controller coupled to the output logic circuitry.

For one embodiment, the current controller in the '883 patent is a resistor reference current controller. The current controller receives two input voltages, $V_{TERM}$ and $V_{REF}$, the latter of which is applied to an input of a comparator. $V_{TERM}$ coupled by a resistor to a node, which is in turn coupled to a second input of the comparator. The voltage at the node is controlled by a transistor array, which is in turn controlled in accordance with an output of the comparator.

When the transistor array is placed in the "off" state, i.e. there is no current flowing through the transistors of the array to ground, the voltage at the node is equal to $V_{TERM}$. In addition, by using the output of the comparator to adjustably activate the transistor array, the '883 patent shows that the voltage at the node may be driven to be approximately equal to the reference voltage, $V_{REF}$.

Knowing the value of $V_{REF}$ and $V_{TERM}$, the current mode driver of the '883 patent therefore provides a binary signaling scheme utilizing a symmetrical voltage swing about $V_{REF}$. Specifically, in a first current state (the "off" state), the current mode driver is not sinking current and the signal line (or bus line) is at a voltage, $V_O = V_{TERM}$, representing a logical "0." In a second current state (the "on" state), the current mode driver is sinking current to drive the voltage on the signal line (or bus line) to be:

$$V_O = V_{TERM} - 2(V_{TERM} - V_{REF}).$$

The second state therefore representing a logical "1."

While the above techniques have met with substantial success, end users of data processing systems, such as computers, continue to demand increased throughput. Whether throughput is expressed in terms of bandwidth, processing speed or any other measure, the bottom line is the desire to get a block of data from point A to point B faster. At the same time, however, it is desirable to achieve such increases without requiring deviation from known semiconductor fabrication techniques.

SUMMARY OF THE INVENTION

A multi-level driver uses multiple pulse amplitude modulation (multi-PAM) output drivers to send multi-PAM signals. A multi-PAM signal has more than two voltage levels, with each data interval now transmitting a "symbol" at one of the valid voltage levels. In one embodiment, a symbol represents two or more bits. The multi-PAM output driver drives an output symbol into a signal line. The output symbol represents at least two bits that include a most significant bit (MSB) and a least significant bit (LSB). A multi-PAM receiver receives the output symbol from the signal line and determines the MSB and the LSB.

In accordance with a first aspect of the invention, a current controller for a multi-level current mode driver is provided. The current controller includes a multi-level voltage reference and at least one source calibration signal. A comparator is coupled by a coupling network to the multi-level voltage reference and the at least one source calibration signal. The current controller further includes a circuit for applying a selected voltage from the multi-level voltage reference and a selected source calibration signal from the at least one source calibration signal to the comparator.

In accordance with a second aspect of the invention, a method of calibrating a multi-level current mode driver is provided. The method includes two current sinks, each capable of sinking current from a termination voltage though a resistor. The first current sink drives a known amount of current through a resistor producing a first input signal. The second current sink is turned on to produce a second input signal. An average value of the first input signal and the second input signal is calculated. The average value of the first input signal and the second input signal is compared to a first known reference voltage. And, the second current sink, and thereby the second input signal, is adjusted until the average value equals the known reference voltage.

BRIEF DESCRIPTION OF THE DRAWINGS

FIGS. 3A and 3B are schematic diagrams of a first and a second multi-level output driver in accordance with embodiments of the present invention.

FIG. 4A is a graph showing gds distortion in a transistor.

FIGS. 4B and 4C illustrate the effect of gds distortion on the output voltage of a four-level output driver encoding in binary and gray code, respectively.

FIGS. 11A and 11B are a flowchart of a method for calibrating the current control circuitry using the setup of FIG. 10 for the output driver shown in FIG. 9A.

FIG. 12 is an electrical schematic of an on-chip, multi-level reference voltage generator utilizing a resistive voltage divider.

FIG. 13D illustrates alternative embodiments for the differential comparator of FIG. 13B.

FIG. 13E illustrates an electrical schematic of a charge coupled comparator using PMOS capacitors.

FIGS. 14C and 14D are timing diagrams for the circuits of FIGS. 14A and 14B.

DETAILED DESCRIPTION OF THE PREFERRED EMBODIMENT(S)

Figure 1:
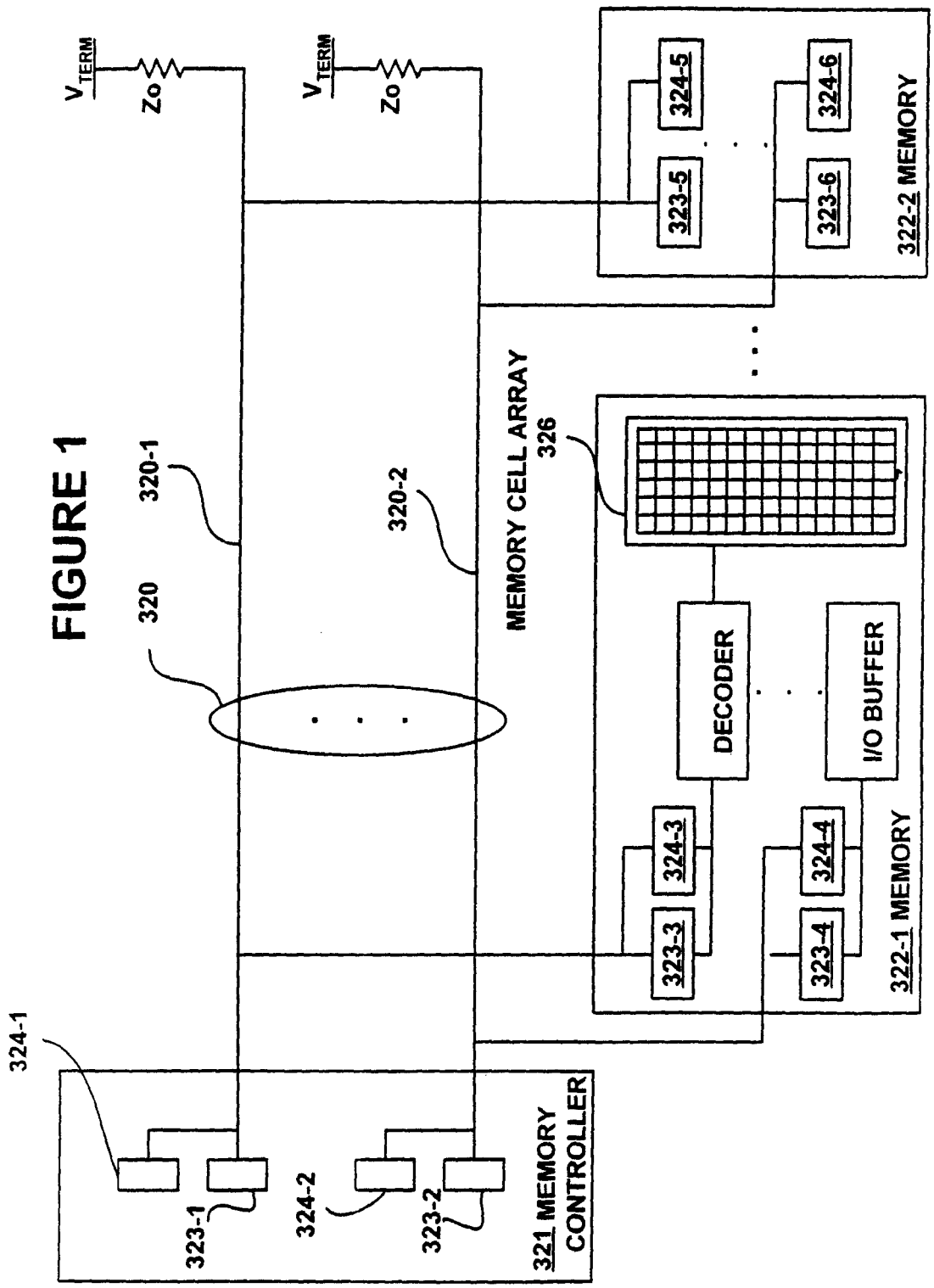
FIG. 1 is a block diagram of a memory controller, bus and memories utilizing an output driver in accordance with a preferred embodiment of the present invention.

In FIG. 1, a bus 320 interconnects a memory controller 321 and memories 322. The bus 302 is formed of signal lines 320-1, 320-2 that transmit address, data and control signals. Physically, on each integrated circuit 321, 322, the address, data and control signals are supplied to and output from external connections, called pins, and the bus 320 interconnects respective pins. The bus 320 may be implemented as traces on a printed circuit board, wires or cables and connectors. Each of these integrated circuits 321, 322 has bus output driver circuits 323 that connect to the pins to interface with the bus 320 to transmit signals to other ones of the integrated circuits. In particular, the bus output drivers 323 in the memory controller 321 and in the memories 322 transmit data over the bus 320. Each bus output driver 323 drives a signal line of the bus 320. For example, bus output driver 323-1 in the memory controller 321 drives bus line 320-1. The bus 320 supports signaling with characteristics that are a function of many factors such as the system clock speed, the bus length, the amount of current that the output drivers can drive, the supply voltages, the spacing and width of the wires or traces making up the bus 320, the physical layout of the bus itself and the resistance of a terminating resistor Zo attached to each bus.

At least a subset of the signal lines connect to pull-up resistors Zo that connect to a termination voltage $V_{TERM}$. In some systems, all signal lines connect to pull-up resistors Zo that connect to the termination voltage $V_{TERM}$. The termination voltage $V_{TERM}$ can be different from the supply voltage $V_{DD}$. In one embodiment, the supply voltage $V_{DD}$ is equal to 2.5 volts, the termination voltage $V_{TERM}$ is equal to 1.8 volts, the bus voltage for a signal at low levels $V_{OL}$ is equal to 1.0 volts, and the voltage swing is 0.8 volts. The resistance of the terminating resistors Zo is equal to twenty-eight ohms.

The output drivers 323 are designed to drive the bus 320 with a predetermined amount of current; and the bus receivers 324 are designed to receive the signals sent by the bus drivers 323 on the bus 320. In a device, each bus receiver 324 receives signals from one signal line of the bus 320. The bus receivers 324 are integrating receivers according to the present invention.

In one embodiment, the memories are random access memories (RAMS). In an alternative embodiment, the memories are read-only memories (ROMs). Alternatively, the bus output drivers 323 and bus receivers 324 of the present invention are implemented in other semiconductor devices that use a bus to interconnect various types of integrated circuits such as microprocessors and disk controllers.

In yet another alternative embodiment, the output drivers are implemented in a point-to-point system. Although a bus that uses current mode signaling has been described with respect to FIG. 1, the apparatus and method of the present invention may be used in any signaling system where it is desirable to distinguish between signals having different voltage levels.

Multi-Level Signaling

Referring back to FIG. 1, in previously known implementations of the bus system, signals transmitted on each signal line of the bus have either of two voltage levels representing a binary zero or one for binary digital communication. For example, an output voltage equal to the voltage level $V_{TERM}$ set by the voltage source at one end of the termination resistor Zo may represent a binary zero. And, an output voltage level equal to $V_{TERM}-(I*Zo)$ may represent a binary one, where the output driver circuit 323 sinks an amount of current equal to I. In this way, the bus driver circuits 323 can be implemented as switched current sources that sink current when driving binary one's onto the signal lines. When receiving data, the receiver circuits 324 detect whether the voltage on the signal line is greater than or less than $V_{TERM}-0.5(I*Zo)$, i.e. the midpoint between a logical zero and a logical one, to determine whether the data is a binary zero or one, respectively. In one embodiment, data is transmitted and received on each edge of the system clock to achieve a data rate equal to twice the frequency of the system clock. In an alternative embodiment, data is transmitted once per clock cycle of the system clock.

As used herein, the term multi-level signaling refers to signaling schemes utilizing two or more signal levels. Multi-level signaling may also be referred to herein as multiple level pulse amplitude modulation, or multi-PAM, signaling, because the preferred coding methods are based upon the amplitude of the voltage signal. Although the multi-level signaling of the preferred embodiments will be described with respect to a current mode bus, multi-level signaling can also be used with a voltage mode bus. In various embodiments of the present invention, the data rate on a bus is increased without increasing either the system clock frequency or the number of signal lines. Output drivers generate, and receivers detect, multi-PAM signals that allow multiple (k) bits to be transmitted or received as one of $2^k$ possible voltages or data symbols at each clock edge or once per clock cycle. For example, one preferred embodiment is a 4-PAM system in which two bits are represented by $2^2$ or four voltage levels, or data symbols, and the two bits are transferred at every clock edge by transferring an appropriate one of the four voltage levels. Therefore, the data rate of a 4-PAM system is twice that of a binary or 2-PAM system.

Multi-PAM is not traditionally used in multi-drop bus systems due, at least in part, to the lower signal-to-noise ratio that is realized when the voltage range is divided into multiple levels. Prior art memory systems have been implemented as only binary systems. A preferred embodiment allows such systems to be implemented using more than two signal levels.

Figure 2:
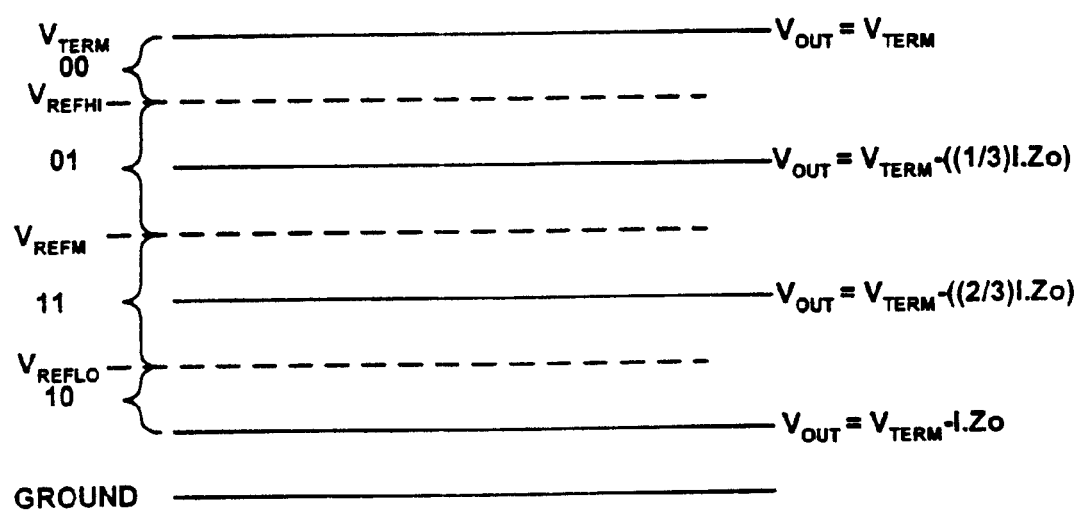
FIG. 2 illustrates a preferred encoding scheme utilizing a multi-level voltage reference for use with a multi-level output driver.

In FIG. 2, a graph shows one embodiment utilizing a 4-PAM signaling scheme. Specifically, the multi-PAM voltage levels are associated with two-bit binary values or symbols such as 00, 01, 10 and 11. In the embodiment of FIG. 2, the binary values are assigned to voltage levels using Gray coding, i.e. the symbol sequence from the highest voltage level to the lowest voltage level is 00, 01, 11, 10. Gray coding provides the advantage of reducing the probability of dual-bit errors because only one of the two bits changes at each transition between voltage levels. If a received 4-PAM voltage symbol is misinterpreted as an adjacent symbol, a single-bit error will occur.

The y-axis of the graph in FIG. 2 shows the associated 4-PAM output voltages $V_{OUT}$ for each symbol. To provide the appropriate voltage to transmit a 4-PAM symbol, the output driver sinks a predetermined amount of current for that symbol. In particular, each symbol is associated with different amount of current. To transmit the symbol "00", the output driver 323 sinks no current and the signal line is pulled up to $V_{TERM}$. To transmit the symbol "01", the bus output driver 323 sinks a predetermined amount of current I01 to cause the output voltage $V_{OUT}$ to equal $V_{TERM}$-(I·Zo), where I01 is equal to ⅓I. To transmit the symbol "11", the bus output driver 323 sinks a predetermined amount of current I11 to cause the output voltage $V_{OUT}$ to equal $V_{TERM}$-⅔(I·Zo), where I11 is equal to ⅔I. To transmit the symbol "10", the bus output driver 323 sinks a predetermined amount of current I to cause the output voltage $V_{OUT}$ to equal $V_{TERM}$-(I·Zo). Further details regarding preferred embodiments of the output driver 323 are provided below.

A 4-PAM receiver identifies a received symbol based on a voltage range or range of voltages associated with that symbol. A set of reference voltages $V_{REFLO}$, $V_{REFM}$ and $V_{REFHI}$ function as thresholds to define ranges of voltages associated with each 4-PAM symbol. In accordance with a preferred embodiment, the reference voltages $V_{REFLO}$, $V_{REFM}$ and $V_{REFHI}$ are set at the midpoint voltage between neighboring symbols. For example, the symbol "00" is associated with voltages greater than $V_{REFHI}$. The symbol "01" is associated with voltages falling within the range between $V_{REFHI}$ and $V_{REFM}$. The symbol "11" is associated with a range of voltages from $V_{REFM}$ to $V_{REFLO}$. The symbol "10" is associated with a range of voltages less than $V_{REFLO}$. The reference voltages $V_{REFHI}$, $V_{REFM}$ and $V_{REFLO}$ are threshold voltages from which a multi-PAM data symbol is determined to be one of the four possible data symbols.

4-PAM symbols or signals also allow for direct compatibility with 2-PAM or binary signaling. When operating in 4-PAM mode, the received data bits are compared to the three reference voltages, $V_{REFHI}$, $V_{REFM}$ and $V_{REFLO}$ to determine the 4-PAM symbol and the associated two bits. Because the most significant bit (MSB) is determined by comparing the received data bit to $V_{REFM}$, i.e. the MSB is zero for voltages greater than $V_{REFM}$ and the MSB is one for voltages less than $V_{REFM}$, the multi-PAM system can be used as a 2-PAM system by ignoring the least significant bit (LSB) and using the MSB. Alternatively, to transmit 2-PAM symbols using the gray code of FIG. 2, the LSB is set equal to zero (low), while the MSB determines the output voltage.

Multi-PAM signaling increases the data rate with a small increase in power consumption because the number of input/output (I/O) pins and the system clock frequency may be the same as that used for binary signaling. The major factor in the power consumption of CMOS circuits, for example, is the $CV^2F$ power, which depends directly on the system clock frequency. Therefore, increasing the system clock frequency to increase the data rate directly increases the power consumption. Although some additional power is used for the additional circuitry of the multi-PAM interface, described below, this increase in power is much less than the increase in power that would occur if either the number of I/O pins or the system clock frequency were increased to increase the data rate.

Multi-PAM signaling also increases the data rate without a corresponding increase in the electro-magnetic interference (EMI). If the data rate were increased by increasing the number of I/O pins or by increasing frequency, the EMI would increase proportionally. Because multi-PAM signaling does not increase the number of I/O pins, the EMI does not increase if the total voltage amplitude of the multi-PAM I/O pins remains the same as that used in binary signaling. The total voltage amplitude may be increased to provide greater voltage margin to improve system reliability. Although the EMI would increase correspondingly, the increase would be small than that incurred by increasing the number of I/O pins with binary signaling.

Although the circuits described below use 4-PAM signaling, the embodiments described can be expanded for use in 8-PAM, 16-PAM and, more generally, N-PAM signaling. Accordingly, it is to be understood that the preferred embodiments are not limited to 4-PAM signaling, but rather may be applied to the general, N-PAM signaling, case.

In FIG. 3A, a 4-PAM output driver circuit 950 is used with current control bits (CCtrl<6:0>) to produced desired output voltage levels over a set of on-chip process, voltage and temperature (PVT) conditions. In the output driver 950, a first driver circuit 952 and a second driver circuit 954 connect to an I/O pin 956. The first driver circuit 952 drives the LSB, while the second driver circuit 954 drives the MSB. The first driver circuit 952 and the second driver circuit 954 have a set of driver blocks 958 that are connected in parallel. Since the driver blocks have the same components, one driver r block 958 will be described. Each driver block has a binary weighted driver transistor 960-0 with a width to length (W/L) ratio as shown. The driver transistors 960 of the second driver circuit 954 are preferably twice as large as the driver transistors of the first driver circuit 952 because the second driver circuit 954 drives the MSB while the first driver circuit 952 drives the LSB. In other words, the MSB is driven with twice as much current as the LSB.

In driver block 958, odd and even data bits are multiplexed onto the driver transistors via passgates 962 and an inverter 964. In this embodiment, odd data is transmitted at the rising edge of the clock, while even data is transmitted at the falling edge of the clock. NAND gates 966,968 connect to current control bit zero <0>, and the LSB Odd Data bit and LSB Even Data bit, respectively. When the respective current control bit zero <0> is high, the NAND gates 966, 968 are responsive to the odd and even data. When the respective current control bit is low, the output of the NAND gates 966,968 is low and driver block 958 does not respond to the data bit. The current control bits provide the specified amount of current to cause the desired voltage swing regardless of the PVT conditions. The circuit of FIG. 3A uses seven current control bits. Techniques for determining the setting of the current control bits are described below.

The passgates 962 include two transistor pairs, each pair including a PMOS transistor 972, 974 connected in parallel with an NMOS transistor 976, 958. The clock and clock_b signals connect in an opposite manner to the gates of the transistors of the transistor pair.

Although FIG. 3A shows that the first driver circuit 952 drives the LSB and the second driver circuit drives the MSB 954, in an alternative embodiment, the first driver circuit 954 drives the MSB and the second driver circuit drives the LSB. Alternatively, any arbitrary coding scheme can be produced by placing combinational logic to combine the data bits before sending the combined data bit to the driver block 958.

Table 1 below shows two 4-PAM encoding schemes that may be implemented using the output driver 950 of FIG. 3A.

TABLE 1

Encoding Schemes

| Coding Scheme | Data Bits (Symbol) to be Transmitted | MSB Input | LSB Input | Output Voltage |
|---|---|---|---|---|
| Binary | 00 | 0 | 0 | $V_{TERM}$ |
|  | 01 | 0 | 1 | $V_{TERM} - \frac{1}{3}(I \cdot Zo)$ |
|  | 10 | 1 | 0 | $V_{TERM} - \frac{2}{3}(I \cdot Zo)$ |
|  | 11 | 1 | 1 | $V_{TERM} - (I \cdot Zo)$ |
| Gray | 00 | 0 | 0 | $V_{TERM}$ |
|  | 01 | 0 | 1 | $V_{TERM} - \frac{1}{3}(I \cdot Zo)$ |
|  | 11 | 1 | 1 | $V_{TERM} - \frac{2}{3}(I \cdot Zo)$ |
|  | 10 | 1 | 0 | $V_{TERM} - (I \cdot Zo)$ |

In another embodiment shown in FIG. 3B, a 4-PAM output driver 980 uses current control bits to control switch transistors in series with the output current source transistors, resulting in the desired output voltage levels. Two sets 981-1 and 981-2 of binary weighted transistors 982-986 combines the current control bits with 4-PAM signal generation. The current control bits directly control current-control NMOS transistors 982-2, 984-2, 986-2 that are connected in series with the driver transistors 982-1, 984-1, 986-1, respectively, that receive the LSB and MSB data. For odd data, the driver transistors 982-1, 984-1, 986-1, cause current to flow to the I/O pin 956 when the respective data bit and the clock signal are high, and the associated current control bit is high to place NMOS transistors 982-2, 984-2 and 986-2 in the active state.

The circuit for even data is not shown, but a separate set of current control NMOS transistors connects in series with a set of driver transistors that respond to the logical "AND" of the respective data bit and the complement of the clock signal clock_b for even data.

The output voltages of the circuits of FIGS. 3A and 3B include gds distortion from the driver transistors. In FIG. 4A, a graph shows gds distortion. The x-axis shows the drain-to-source voltage, and the y-axis shows the drain current. Specifically, gds of a MOS transistor is the change of drain current in response to a change in drain voltage. FIGS. 4B and 4C show the data bits, in binary and gray code respectively, and the effect of gds distortion on the output voltage $V_{OUT}$. In particular, as the output voltage $V_{OUT}$ decreases, the incremental voltage difference between adjacent bits pairs decreases. Because of gds distortion, the voltage increments between the 4-PAM voltages are generally not equal.

Figure 5A:
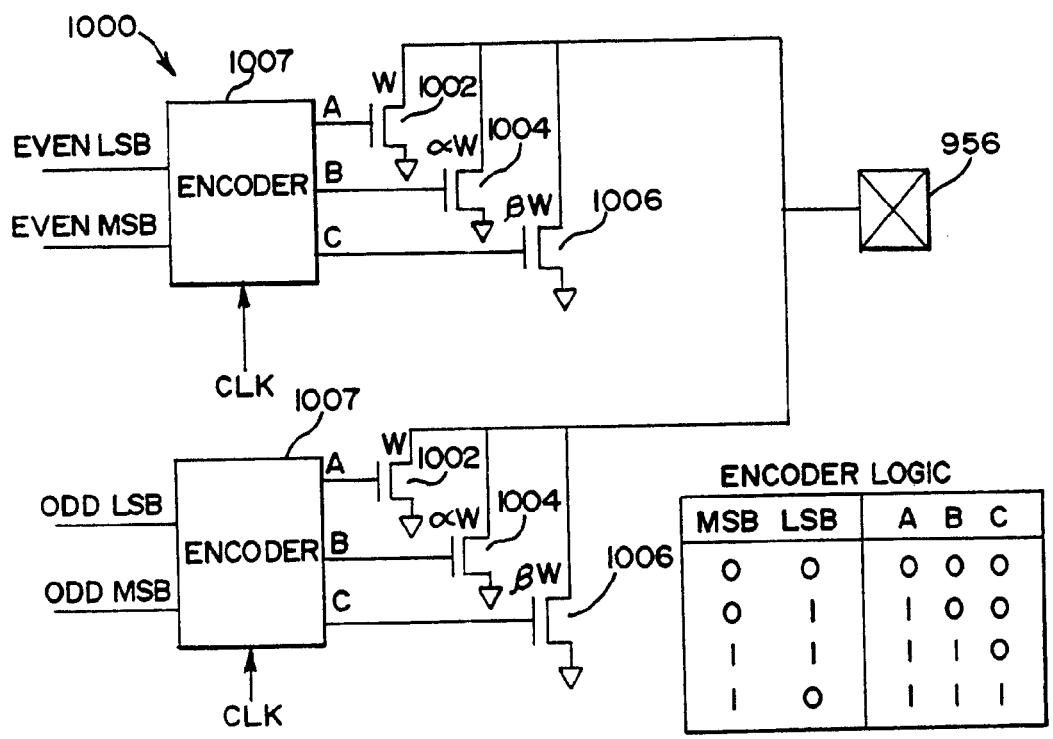
FIG. 5A is an electrical schematic of a multi-level output driver, having a binary generator, that corrects for gds distortion.

In FIG. 5A, a 4-PAM output driver 1000 that corrects for gds distortion is shown. The output driver 1000 is two-way multiplexed, with the multiplexing occurring at the I/O pin 956. The output driver is of the open-drain type and operated in current-mode, with the output current set by a bias voltage on a current source device coupled in series with each of the transistors 1002, 1004 and 1006. For simplicity the current control transistors are not shown. In accordance with a preferred embodiment, a new output symbol is generated on each rising and falling edge (referred to herein as "odd" and "even," respectively) of the clock.

The gds distortion is eliminated by adjusting the width to length (W/L) ratio of transistors 1004 and 1006 by factors $\alpha$ and $\beta$, such that $\beta > \alpha > 1$ and the incremental voltage difference between adjacent 4-PAM levels is constant. Transistors 1002, 1004 and 1006 have a width to length ratio of W/L, $\alpha$(W/L), and $\beta$(W/L) respectively.

Examples of encoding schemes that may be implemented using the output driver of FIG. 5A are shown in Table 2 below. In accordance with a preferred embodiment, input signals A, B, and C are derived from the MSB and LSB of a symbol to be transmitted to produce the 4-PAM levels as shown in Table 2 below. The encoder of the output driver 1000 uses combinational logic 1007 to produce the A, B and C inputs according to Table 2.

TABLE 2

Mapping of Data Bits to ABC Inputs and Encoding Schemes

| Coding Scheme | Data Bits (Symbol) to be Transmitted | A | B | C | Output Voltage |
|---|---|---|---|---|---|
| Binary | 00 | 0 | 0 | 0 | $V_{TERM}$ |
|  | 01 | 1 | 0 | 0 | $V_{TERM} - \frac{1}{3}(I \cdot Zo)$ |
|  | 10 | 1 | 1 | 0 | $V_{TERM} - \frac{2}{3}(I \cdot Zo)$ |
|  | 11 | 1 | 1 | 1 | $V_{TERM} - (I \cdot Zo)$ |
| Gray | 00 | 0 | 0 | 0 | $V_{TERM}$ |
|  | 01 | 1 | 0 | 0 | $V_{TERM} - \frac{1}{3}(I \cdot Zo)$ |
|  | 10 | 1 | 1 | 0 | $V_{TERM} - \frac{2}{3}(I \cdot Zo)$ |
|  | 11 | 1 | 1 | 1 | $V_{TERM} - (I \cdot Zo)$ |

Figure 5B:
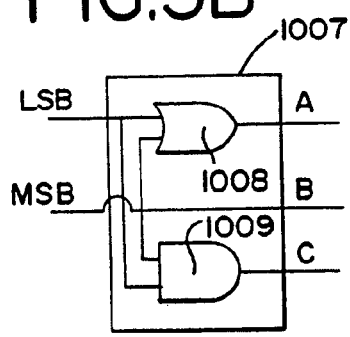
FIG. 5B is an electrical schematic of an alternate embodiment of the binary generator shown in FIG. 5A.

A binary encoder 1007 is illustrated in FIG. 5B. In the encoder 1007, an OR gate 1008 generates the A signal by performing an OR operation between the LSB and MSB. The B input is the MSB. An AND gate 1009 generates the C signal by performing an AND operation between the LSB and MSB.

Figure 5C:
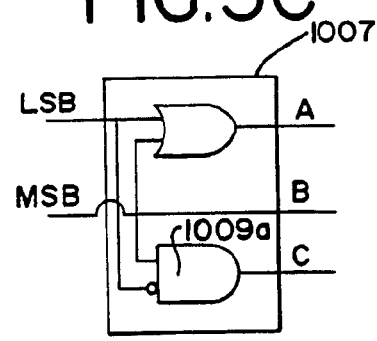
FIG. 5C is an electrical schematic of another alternate embodiment of the binary generator shown in FIG. 5A.

In FIG. 5C, an alternative preferred encoder 1007 encodes the LSB and MSB using Gray code. The encoder 1007 of FIG. 5C is the same as the encoder 1007 of FIG. 5B except that, to generate the C signal, the AND gate 1009*a* receives the complement of the LSB rather than the LSB.

Figure 9A:
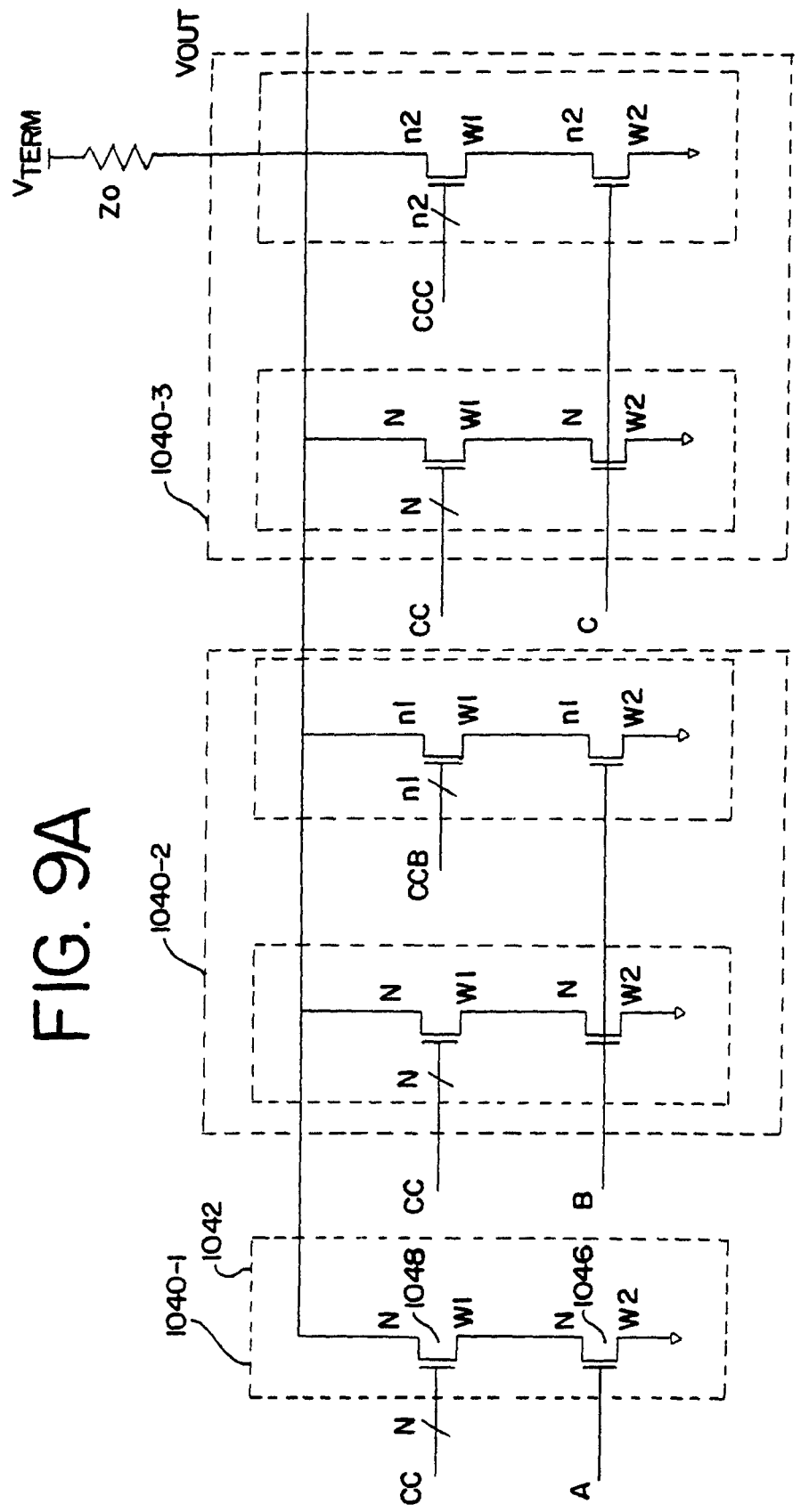
FIG. 9A is an electrical schematic of a gds compensated, multi-level output driver with current control circuitry.
Figure 9B:
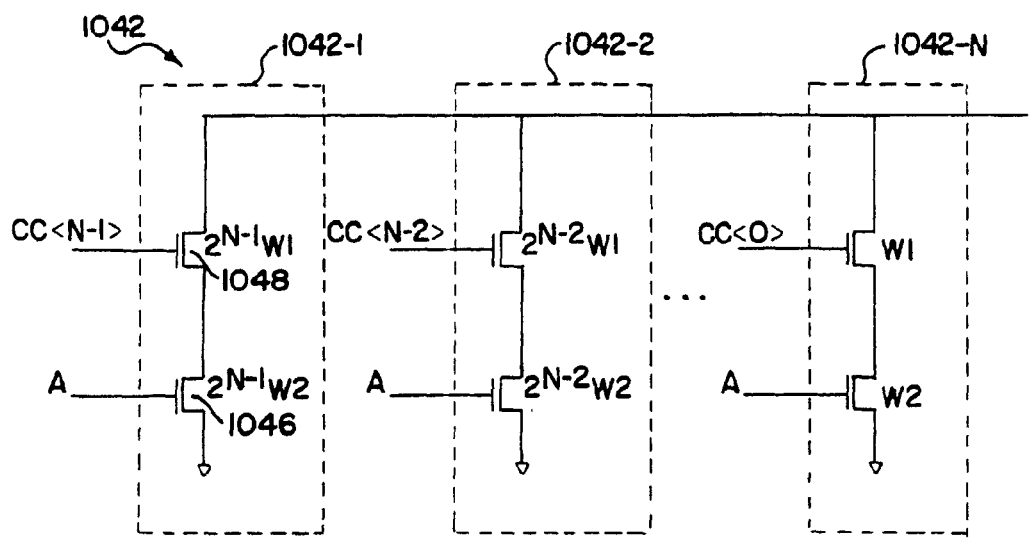
FIG. 9B is an electrical schematic of a set of stacked transistor pairs for a current drive block, such as the current drive blocks shown in FIG. 9A.
Figure 9C:
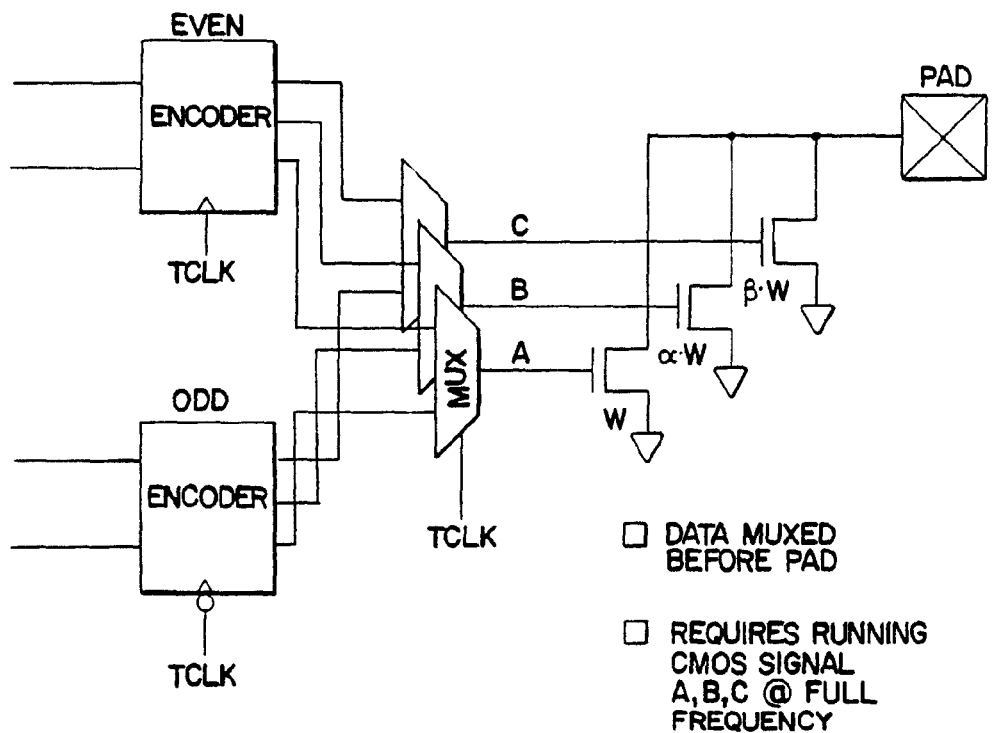
FIG. 9C is an electrical schematic of a preferred gds compensated, multi-level output driver.

In FIG. 9C, an alternative preferred embodiment of the gds compensated output driver is shown. In this embodiment, the output driver has separate odd and even symbol encoders, with the encoder outputs being multiplexed at the gates of the output transistors.

On-chip, single-ended output drivers, as shown in FIGS. 3A and 3B generate switching noise. For example, when the transistors in the output driver transition from sinking no current such as when driving the "00" symbol, to sinking maximum current such as when driving the gray-coded "10" symbol, the current surges through the I/O pin 956 and through a ground pin. The path between I/O pin 956 and ground has inherent inductance that opposes the current surge and produces significant switching noise (i.e., ground bounce). Because the voltage margins for multi-PAM signaling are less than the voltage margins for binary signaling, switching noise may cause decoding errors.

Figure 6:
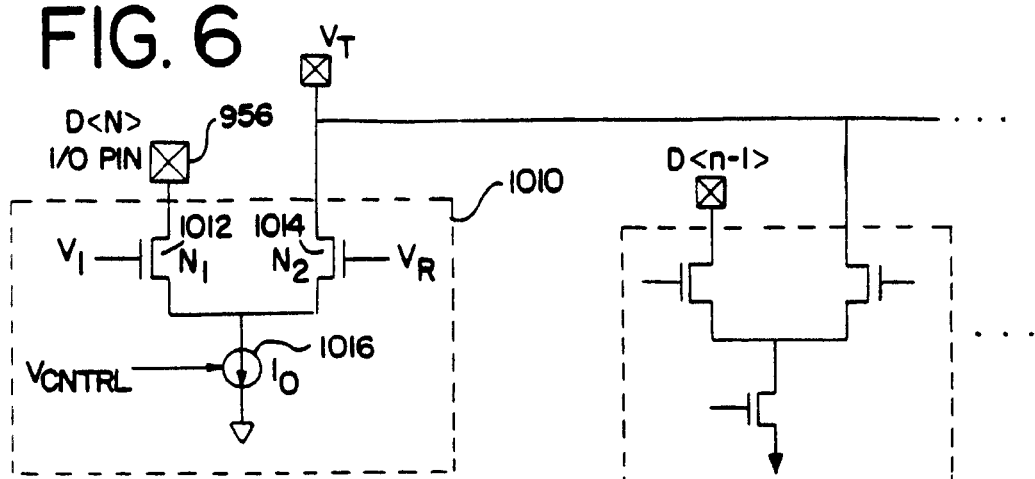
FIG. 6 is an electrical schematic of a circuit to reduce switching noise at an output pin.

To reduce sensitivity to switching noise, output drivers can provide a constant or semi-constant current to ground regardless of the output current being driven. As shown in FIG. 6, each single-ended transistor branch 960 (FIG. 3A) and 986 (FIG. 3B) in the output drivers of FIGS. 3A and 3B is replaced with a differential pair 1010.

When the output driver sinks output current from the I/O pin 956, current is steered through transistor N1 1012 to ground. When transistor N1 1012 is inactive, transistor N2 1014 becomes active to allow the same or substantially the same amount of current to flow to ground. In this way, a substantially constant amount of current continuously flows to ground to eliminate a large portion of the output driver switching noise and provide a quieter on-chip ground, thereby improving the performance of the 4-PAM signaling. The signal $V_I$, is the signal that drives transistor N1 1012. Alternatively, the signal $V_R$ that drives transistor N2 1014 is a reference voltage between ground and $V_I$. In response to an input voltage $V_{CNTRL}$, the current source 1016 sinks a predetermined current Io to ground.

Figure 7:
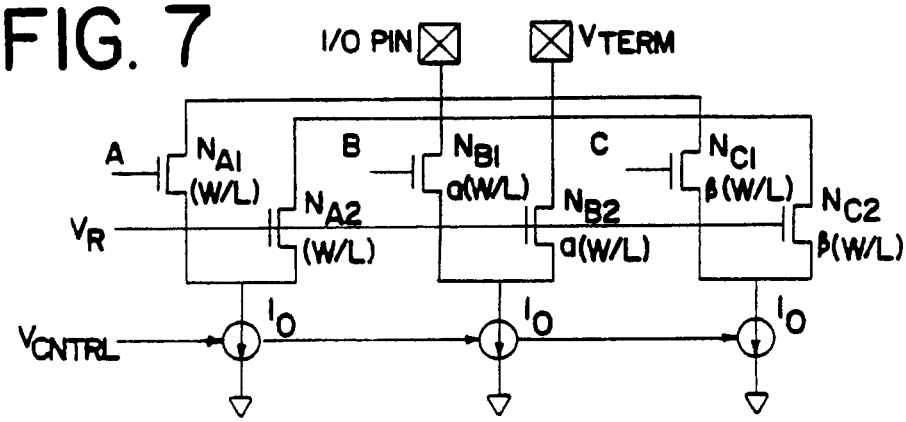
FIG. 7 is an electrical schematic of a multi-level driver, such as the driver shown in FIG. 5A, that further incorporates a circuit to reduce switching noise, such as the circuit shown in FIG. 6.

FIG. 7 is another embodiment of a multi-PAM output driver that combines the circuit of FIG. 5A, which eliminates gds distortion, with the circuit of FIG. 6 to reduce sensitivity to switching noise.

Figure 8:
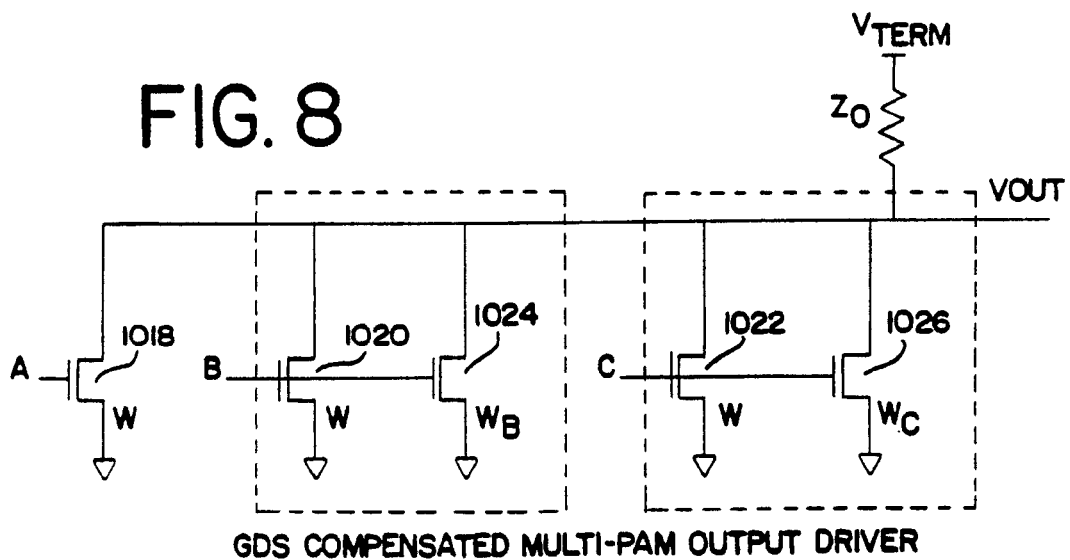
FIG. 8 is an electrical schematic of another alternative gds compensated, multi-level output driver.

In FIG. 8, yet another gds compensated 4-PAM output driver is shown. In the 4-PAM output driver, the A, B, and C signals drive equal-sized NMOS transistors 1018, 1020, 1022 having width W. In accordance with a preferred embodiment, signals B and C also drive NMOS transistors 1024, 1026 of width $W_B$ and $W_C$, respectively, to compensate for gds distortion. The widths of the NMOS transistors 1024 and 1026, $W_B$ and $W_C$, respectively, are chosen such that the difference between output levels for adjacent bits is substantially the same, such as ⅓(I·Zo). The widths of the transistors 1018-1026 may therefore have the following relationship:

$$W + W_C > W + W_B > W$$

In FIG. 9A, a 4-PAM output driver corrects the gds distortion and provides current control. As described above, the signals A, B and C preferably determine the output voltage or symbol in accordance with the gray-coded binary signaling shown in Table 2, above. In addition, three sets of current control calibration bits, CC, CCB and CCC, respectively determine the amount of current supplied by the output driver for various combinations of A, B and C. The first set of control bits CC provides primary current control, while the second and third sets of current control bits, CCB and CCC, respectively, fine tune the amount of current. The first set of current control bits CC has N bits; the second set of current control bits CCB has n1 bits; and the third set of current control bits CCC has n2 bits. In one embodiment, the relationship between the number of current control bits is as follows:

$$n1 \leq n2 < N.$$

There may be different relationships between N, n1 and n2 in alternative embodiments.

Each of the A, B and C signals is associated with a current drive block 1040 to drive a predetermined amount of current associated with the symbol. Each current drive block 1040 includes one or more sets of stacked resistor pairs 1042 that are associated with each set of current control bits for that current driver block 1040. For example, the current drive block 1040-1 that drives the A signal receives current control bits CC. The current drive block 1040-2 that drives the B signal receives current control bits CC and CCB. The amount of current supplied by current drive block 1040-2 is adjusted for gds distortion using the CCB bits. The current drive block 1040-3 that drives the C signal receives current control bits CC and CCC. The amount of current supplied by current drive block 1040-3 is adjusted for gds distortion using the CCC bits.

Referring also to FIG. 9B, a set of stacked transistor pairs 1042 is shown. Each stacked transistor pair 1042 includes two NMOS transistors 1046, 1048 connected in series. The lower NMOS transistor 1046 connects to the one of the A, B, or C signals associated with the current drive block 1040. The upper NMOS transistor 1048 connects to a current control bit. The lower NMOS transistor 1046 is preferably wider than the upper NMOS transistor 1048. Because there are N CC bits, there are N stacked transistor pairs. For example, the current control block 1040 has N stacked transitory pairs 1042-1 to 1042-N, and each stacked transistor pair connects to one of the current control bits, CC<0> to CC<N−1>.

The transistors of the stacked transistor pairs are binary weighted with respect to minimum width of W1 for the upper transistors and W2 for the lower transistors. The widths W1 and W2 may be chosen to determine output characteristics such as output resistance and capacitance. Generally the widths W1 and W2 are chosen such that W1 is less than W2.

Although drawn to illustrate the circuit for the CC current control bits, the circuit diagram of FIG. 9B also applies to the sets of stacked transistor pairs associated with the CCB and CCC current control bits.

Figure 10:
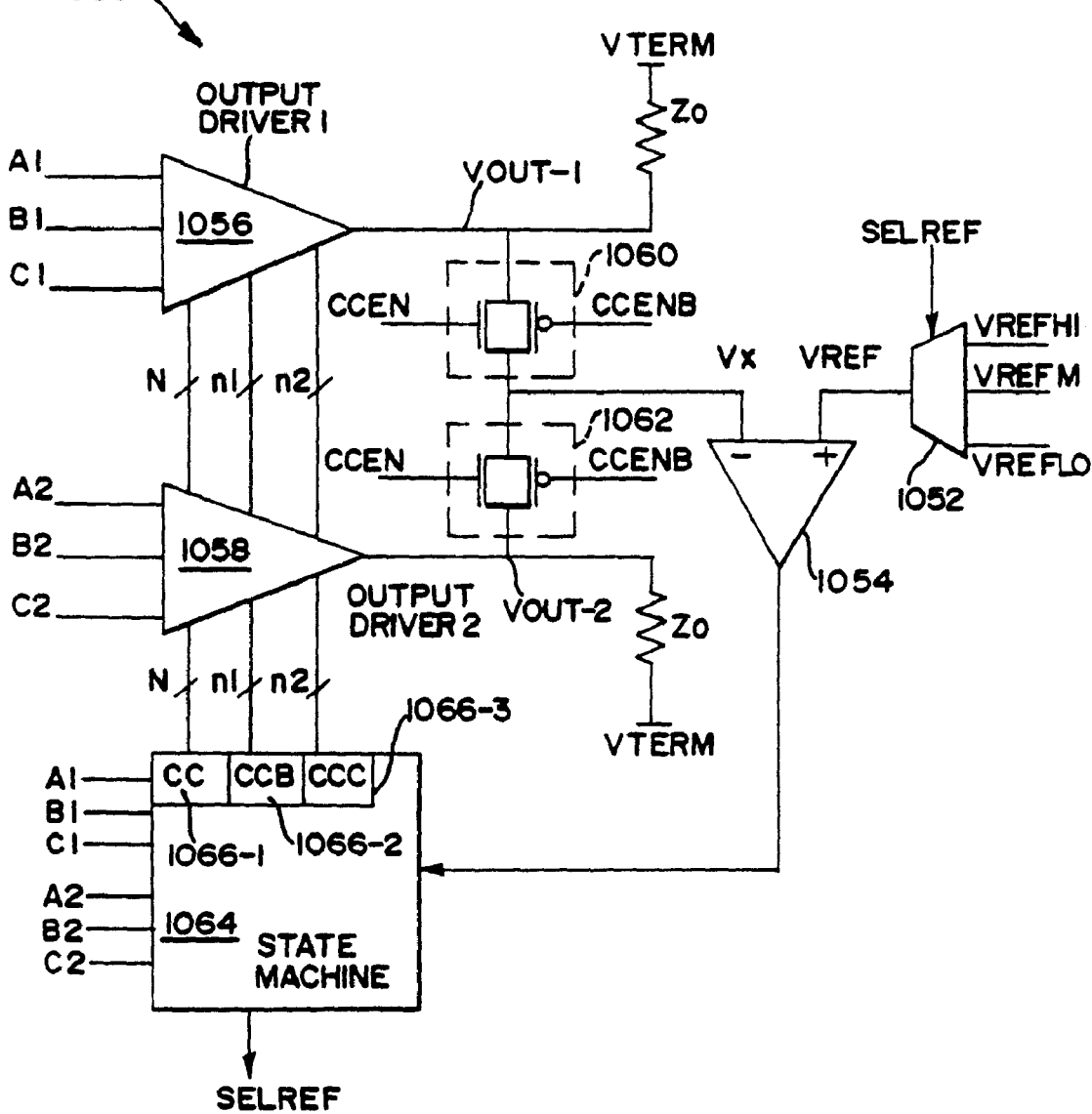
FIG. 10 is an electrical schematic of a circuit for calibrating a gds, compensated output driver with current control circuitry.

As shown in FIG. 10, a current control calibration circuit 1050 determines the settings for the current control bits CC, CCB and CCC by selecting a current control reference voltage, $V_{REF}$, and comparing the current control reference voltage, $V_{REF}$, to a voltage at a mid-point between two calibration output voltages, $V_{OUT-1}$ and $V_{OUT-2}$. The current calibration circuit 1050 determines settings for each of the sets of current control bits CC, CCB and CCC for each 4-PAM output voltage such that $V_{OUT-1}$ and $V_{OUT-2}$ provide each adjacent pair of voltage levels to the circuit.

A multiplexor 1052 receives the three 4-PAM reference voltages $V_{REFHI}$, $V_{REFM}$ and $V_{REFLO}$ A select reference voltage signal, SelRef, selects one of the referenced voltages as the selected current control reference voltage, $V_{REF}$. A comparator 1054 compares the selected current control reference voltage $V_{REF}$ to a mid-point voltage $V_X$ and generates a comparison signal.

To generate the mid-point $V_X$, output driver 1 (1056) sinks a first amount of current to provide the first output voltage $V_{OUT-1}$ and output diver 2 (1058) sinks a second amount of current to provide the second output voltage $V_{OUT-2}$. Two passgate pairs 1060, 1062, in response to a current control enable and its complementary signal, act as a resistor divider to provide the midpoint voltage, $V_X$, between the first output voltage, $V_{OUT-1}$, and the second output voltage, $V_{OUT-2}$.

A state machine 1064 includes first, second and third counters, 1066-1, 1066-2 and 1066-3 that provide the first, second and third sets of current control bits, CC, CCB and CCC, respectively. If the comparison signal indicates that the midpoint signal $V_X$ is greater than the reference voltage $V_{REF}$, the state machine 1064 increments an associated set of current control bits by one to increase the amount of current that is sunk by the output driver, thereby decreasing the midpoint voltage. If the midpoint voltage signal $V_X$ is less than the current control reference voltage, $V_{REF}$, the state machine 1064 decrements the associated current control bits by one, thereby increasing the midpoint voltage.

In one embodiment, the current control bits are calibrated during a power-up sequence. The theory of operation for calibrating the current control bits is as follows. The first set of current control bits CC provide the primary amount of current control for each current control block 1040. To compensate for gds distortion, the CCB and CCC current control bits fine tune the amount of current associated with the Gray-coded "11" and "10" signals, respectively. The current control bits are calibrated in the following order: CC, CCB, then CCC.

In alternative embodiments, the current control bits may be calibrated after power-up in response to triggering events, e.g., lapse of a period of time, a change in ambient temperature, a change in power supply voltage, or in response to a threshold number of errors.

Referring also to FIG. 4B, the first and main set of current control bits CC are set using the voltage differences between the "00" and "01" symbols. The first set of current control bits CC are set to provide a amount of current to provide the output voltage for the "01" symbol such that $V_{REFHI}$ is placed at the midpoint between the output voltage for the "00" symbol and the output voltage for the "01" symbol. As shown in FIG. 4B, because of gds distortion, without compensation, the voltage difference between the "01" symbol and the "11" symbol is less than the voltage difference between the "00" symbol and the "01" symbol. To compensate for the gds distortion, the output voltage for the "11" symbol is decreased by increasing the amount of current sunk by the output driver. The second set of current control bits CCB are set to increase the current sunk by the output diver such that the output voltage becomes equal to the desired voltage level when the midpoint voltage between output voltage for the "01" and "11" is equal to $V_{REFM}$.

Finally, the third set of current control bits CCC is adjusted such that the midpoint voltage between output voltage for the "11" and "10" is equal to $V_{REFLO}$.

Referring to FIGS. 10, 11A and 11B, the operation of the circuit 1050 including the state machine 1064 will be described. The flowchart of FIGS. 11A and 11B uses gray coded output voltages. In step 1070, the current control enable signal (ccen) and its complement (ccenb) are set to activate the passgate pairs 1060 and 1062 and output the midpoint voltage $V_X$, described above.

Three major blocks of steps 1072, 1074 and 1076 set the current control bits, CC, CCB and CCC, respectively.

In block 1072, step 1078 sets the initial conditions for determining the settings for the first set of current control bits CC. The state machine 1064 outputs the select reference voltage signal (SelRef) which causes the multiplexor 1054 to output the reference voltage $V_{REFHI}$ to the comparator 1054. A "00" symbol is supplied to output driver 1 (1056) by outputting multi-PAM bit selection signals A1, B1 and C1 with values of zero. A "01" symbol is supplied to output driver 2 (1058) by outputting multi-PAM bit selection signals A2 with a value of one, and B2 and C2 with a value of zero. The initial state of the first, second and third current control bits is as follows:

CC={1 0 0 . . . 0};

CCB={1 0 0 . . . 0}; and

CCC={1 0 0 . . . 0}.

The current control bits are initially set such that the stacked transistor pair sinking the most current will be activated.

In step 1080, the output drivers 1 and 2 output the voltages corresponding to the symbols "00" (the $V_{TERM}$ reference) and "01" (the drive level under calibration) and the midpoint voltage $V_X$ is generated. In step 1082, the comparator 1054 compares the midpoint voltage $V_X$ to the selected reference voltage $V_{REFHI}$. When the midpoint voltage is within one least significant bit of the reference voltage $V_{REFHI}$, the first set of current control bits have the proper setting. The state machine 1058 determines that the midpoint voltage $V_X$ is within one least significant bit of the reference voltage $V_{REFHI}$ when the current control bits begin to dither between two settings. In other words, the output of the comparator will alternate between a zero and a one.

In step 1084, when the midpoint voltage $V_X$ is not within one least significant bit of the reference voltage $V_{REFHI}$ the state machine 1064 augments the first set of current control bits depending on the result of the comparison. The term "augment" is used to indicate either incrementing or decrementing the current control bits. The process proceeds to step 1080.

If, in step 1082, the state machine 1064 determines that the midpoint voltage $V_X$ is within one least significant bit of the reference voltage, the process proceeds to step 1086 to calibrate the second set of current control bits, CCB.

In step 1086, the initial conditions for calibrating the second set of current control bits CCB are set. The state machine 1064 outputs the select reference voltage signal (SelRef) which causes the multiplexor 1054 to output the reference voltage $V_{REFM}$ to the comparator 1054. A "01" symbol is supplied to output driver 1 (1056) by outputting multi-PAM bit selection signals A1 with a value of one, and B1 and C1 with values of zero. An "11" symbol is supplied to output driver 2 (1058) by outputting multi-PAM bit selection signals A2 and B2 with a value of one, and C2 with a value of zero. The state of the first set of current control signals CC remains unchanged. The initial state of the second and third sets of current control bits, CCB and CCC, respectively, is as follows:

CCB=[1 0 0 . . . 0];

CCC=[1 0 0 . . . 0].

In step 1088, the output drivers 1 (1056) and 2 (1058) output the voltages corresponding to the symbols "01" (the level calibrated in step 1072) and "11" (the level now under calibration), and the passgate pairs 1060, 1062 output the midpoint voltage $V_X$. In step 1090, the comparator 1054 compares the midpoint voltage $V_X$ to the selected reference voltage $V_{REFM}$. When the midpoint voltage is not within one least significant bit of the reference voltage $V_{REFM}$ as described above with respect to $V_{REFHI}$, in step 1092, the state machine 1064 augments the second set of current control bits CCB by one and the process repeats at steps 1086.

When the midpoint voltage is within one least significant bit of the reference voltage $V_{REFM}$ as described above with respect to $V_{REFHI}$, the second set of current control bits CCB have the proper setting and the process proceed to step 1094 to calibrate the third set of current control bits, CCC.

In step 1094, the initial conditions for calibrating the third set of current control bits CCC are set. The state machine 1064 outputs the select reference voltage signal (SelRef), which causes the multiplexor 1054 to output the reference voltage $V_{REFLO}$ to comparator 1054. A "11" symbol (calibrated in step 1074) is supplied to output driver 1 (1056) by outputting multi-PAM bit selection signals A1 and B1 with a value of one, and C1 with a value of zero. A "10" symbol (the level now under calibration) is supplied to output driver 2 (1058) by outputting multi-PAM bit selection signals A2, B2 and C2 with a value of one. The state of the first and second sets of current control signals CC and CCB, respectively, remains unchanged. The initial state of the third sets of current control bits CCC is as follows:

CCC={1 0 0 . . . 0}.

In step 1096, the output drivers 1 (1056) and 2 (1058) output the voltages corresponding to the symbols "11" and "10" and the passgate pairs 1060, 1062 output the midpoint voltage $V_X$. In step 1098, the comparator 1054 compares the midpoint voltage $V_X$ to the selected reference voltage $V_{REFLO}$. When the midpoint voltage is not within one least significant bit of the reference voltage $V_{REFLO}$, as described above with respect to $V_{REFHI}$ in step 1100, the state machine 1064 augments the third set of current control bits CCC by one and the process repeats at step 1094.

In step 1098, when the midpoint voltage is within one least significant bit of the reference voltage $V_{REFLO}$, the appropriate settings for the first, second and third sets of current control bits, CC, CCB and CCC respectively are determined and the calibration is complete.

For the foregoing embodiment, a sequential search is described: starting at an initial value and augmenting. It should be emphasized, however, that alternative search techniques known to those skilled in the art may be used. For example, without limiting the foregoing, successive approximation using a binary search may be used. As a further, although less desirable because it is hardware intensive, alternative, a direct flash conversion may be used.

In FIG. 12, a 4-PAM reference voltage generator 1380 generators the multi-PAM reference voltages $V_{REFHI}$, $V_{REFM}$ and $V_{REFLO}$ from external voltages, $V_{TERM}$ and $V_{REF}$, supplied on input pins 1382, 1384 respectively. Unity gain amplifiers 1386, 1388 receive and output the input voltages $V_{TERM}$ and $V_{REF}$ respectively. A voltage divider, including series-connected resistors R1, R2 and R3, is coupled between the outputs of the unity gain amplifiers 1386 and 1388. The lowest voltage $V_{REF}$ is selected to drive $V_{REFLO}$ via a power driver 1390. Power drivers 1392, 1394 are coupled between resistors R3, R2 and R2 to provide reference voltages $V_{REFHI}$ and $V_{TERM}$ respectively. The power drivers 1390-1394 are connected as unity gain amplifiers.

In one embodiment, the resistor values are selected such that resistors R2 and R3 have twice the resistance of resistor R1, and $V_{REF}$, which is supplied externally, is equal to the desired $V_{REFLO}$ voltage.

Figure 13A:
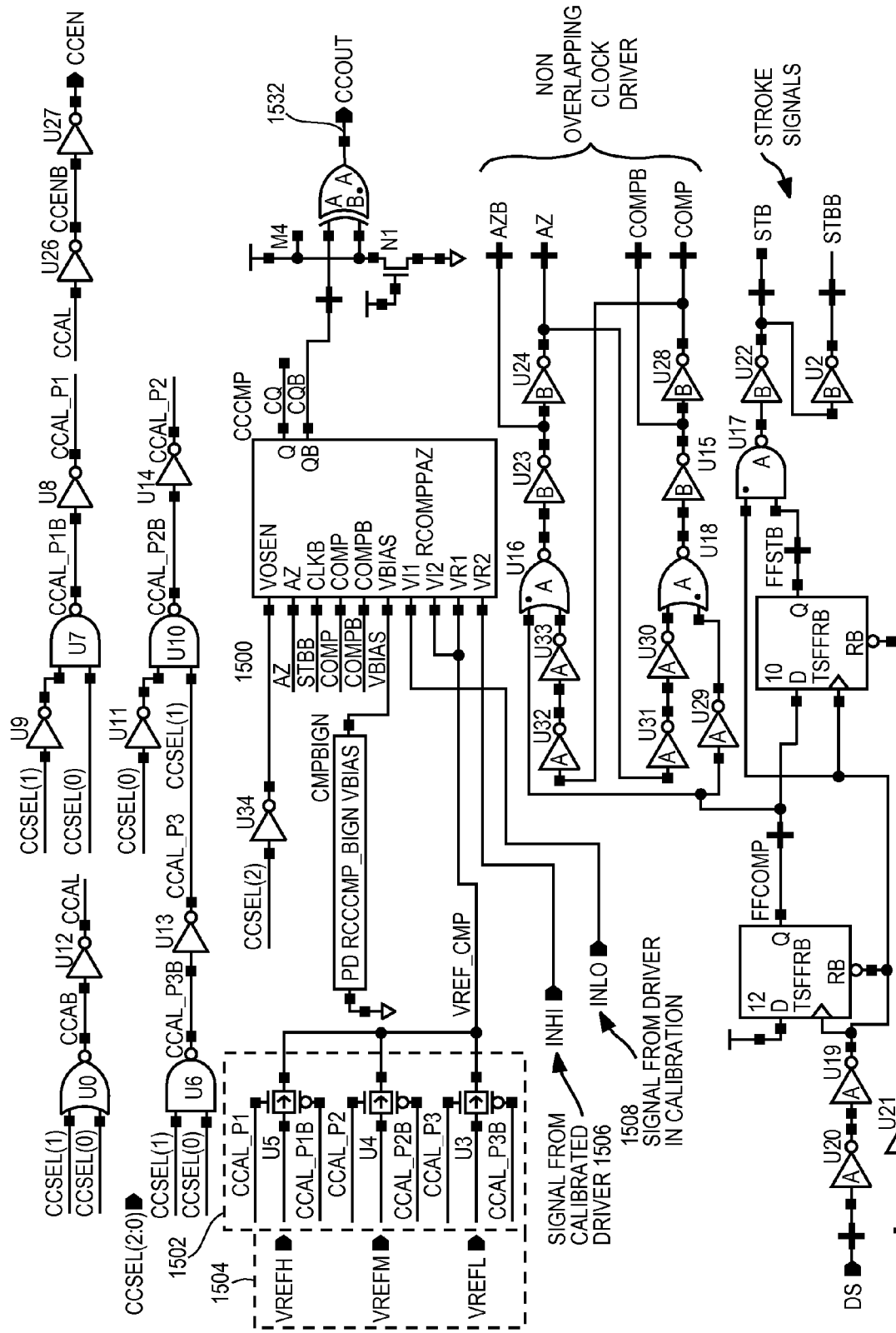
FIGS. 13A and 13B are electrical schematics of a first preferred alternative to the current control calibration circuit of FIG. 10.
Figure 13B:
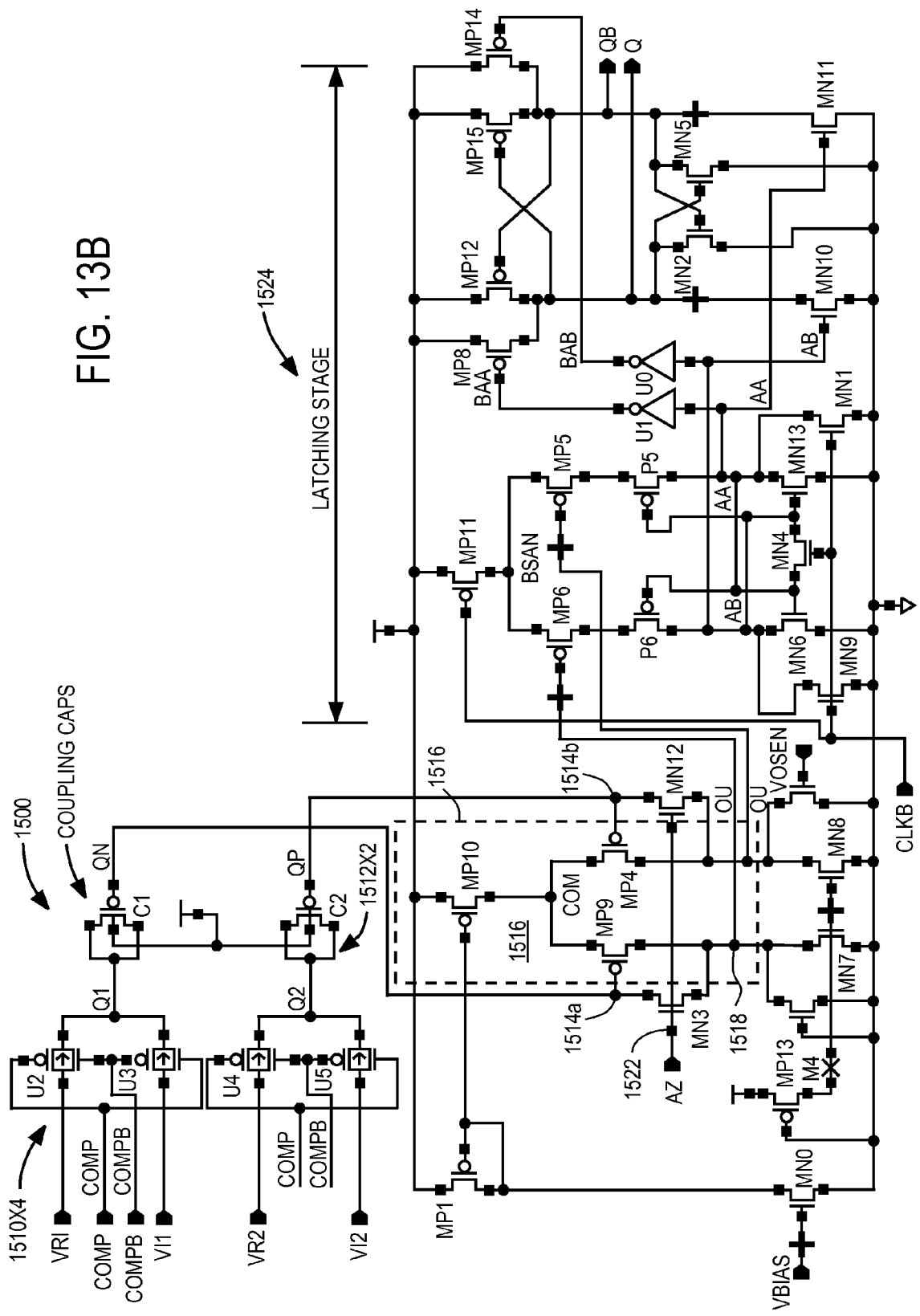

An electrical schematic of a first preferred alternative to the current control calibration circuit of FIG. 10 is shown in FIGS. 13A and 13B. In FIG. 13A, a comparator 1500 is coupled by a multiplexor 1502 to a multi-level voltage reference 1504, which in this case includes three discrete levels. One of the three reference voltage levels, $V_{REFHI}$, $V_{REFM}$ or $V_{REFLO}$, is selectively applied to two inputs of the comparator 1500, as further described below. The comparator 1500 is also coupled to receive source calibration signals 1506 and 1508, which are supplied by current mode drivers, such as the 4-PAM driver 1000 shown in FIG. 5A. The source calibration signals 1506 and 1508, for the embodiment shown, include a first driver output at a known, or previously calibrated, voltage level on the input line 1506 and an unknown driver output voltage level on the input line 1508, such that the signal on input line 1508 is the signal being calibrated. The comparator 1500 provides an output for adjusting or calibrating the output of the drivers on input line 1508, as further described below, so that the driver output can be reliably received and decoded.

FIG. 13B is an electrical schematic of the comparator 1500 shown in FIG. 13A. The two inputs from the multiplexor 1502 and the source calibration signals 1506 and 1508 are each coupled to an input of a switch 1510. The outputs of the switches 1510 are combined in pairs and each combined switch output is connected to a coupling capacitor 1512. The coupling capacitors 1512 are connected to opposing inputs 1514a and 1514b of a transistor comparator 1516. The output of the transistor comparator 1516 is the voltage across nodes 1518 and 1520. Two switches 1522 selectively couple the output nodes 1518 and 1520 to the inputs 1514a and 1514b, respectively. The output nodes 1518 and 1520 are coupled to a latching stage 1524.

As illustrated in FIG. 13B, the elements of the comparator 1500, including the switches 1510, the coupling capacitors 1512, the amplifier 1516 and the switches 1522, are preferably implemented as semiconductor devices in an integrated circuit. The coupling capacitors 1512 are preferably constructed using MOS transistors connected as capacitors but other embodiments may alternatively use other capacitor types. Those skilled in the art of integrated circuit design will appreciate that, as a result of process variation, there is likely to be a random offset voltage associated with the transistor comparator 1516. In other words, if the same voltage is applied at the inputs 1514a and 1514b, a finite voltage will appear across output nodes 1518 and 1520, rather than the ideal case in which the output nodes 1518 and 1520 are at the same potential. While the offset voltage is not typically significant for systems using binary or 2-PAM signaling, it is preferable to correct for the offset voltage in systems using four or more signal levels, such as a 4-PAM system.

The comparator 1500 of FIG. 13B therefore includes offset cancellation circuitry. Specifically, the coupling capacitors 1512 and the switches 1522 are operable to provide offset cancellation as follows. During the cancellation phase, which may also be referred to herein as the auto-zero phase, signal az, which is coupled to the gates of the transistor switches 1522, is high. Referring back to FIG. 13A momentarily, the signal az is generated by a non-overlapping clock driver, which includes elements U29, U16, U18, etc. The non-overlapping clock driver produces skewed signals, with a delay period between transitions.

Referring again to FIG. 13B, when the signal az goes high, the amplifier 1516 is placed into unity gain mode by turning on switches 1522 and the offset voltage is stored on the coupling capacitors 1512. In addition, during the auto-zero phase, the switches 1510 are set to apply, in this particular embodiment, the reference voltage supplied by the multiplexor 1502 and the known output driver voltage 1506 to the coupling capacitors 1512. Thus, during the auto-zero phase, the transistor comparator 1516 samples the difference between the two known voltages as modified by the offset voltage of transistor comparator 1516.

At the end of the auto-zero phase, switches 1522 are opened, placing the amplifier 1516 into a high gain mode, and then there is a momentary delay followed by a compare phase. At the start of the compare phase, the state of the switches 1510 is changed to sample the reference voltage supplied by the multiplexor 1502 and the unknown output driver voltage 1508 onto the coupling capacitors 1512. Because the charge stored from the auto-zero phase is trapped on the coupling capacitors 1512, any change in the input voltages, such as the change to the unknown output driver voltage 1508, produces a voltage across the input nodes 1514a and 514b of the transistor comparator 1516. This in turn produces an output voltage across the nodes 1518 and 1520 that is preferably latched into a latching stage 1524.

The control logic enables strobing of the latching stage 1524. In accordance with a preferred embodiment, the latch 1524 may be strobed multiple times during a single compare phase. Alternatively, the latch 1524 may be strobed only once during a single compare phase.

In accordance with a preferred embodiment, a current control transistor in the current mode driver is adjusted, for example as described above with respect to FIGS. 10, 11A and 11B or as described in U.S. Pat. No. 5,254,883, based upon the output of the transistor comparator 1516. In accordance with a preferred embodiment, the unknown driver output voltage level on line 1508 is incrementally adjusted, such as by increasing or decreasing the amount of current sunk by the output driver, until the average value of the voltage levels on lines 1506 and 1508 is equal to the reference voltage supplied by the multiplexor 1502.

Figure 13C:
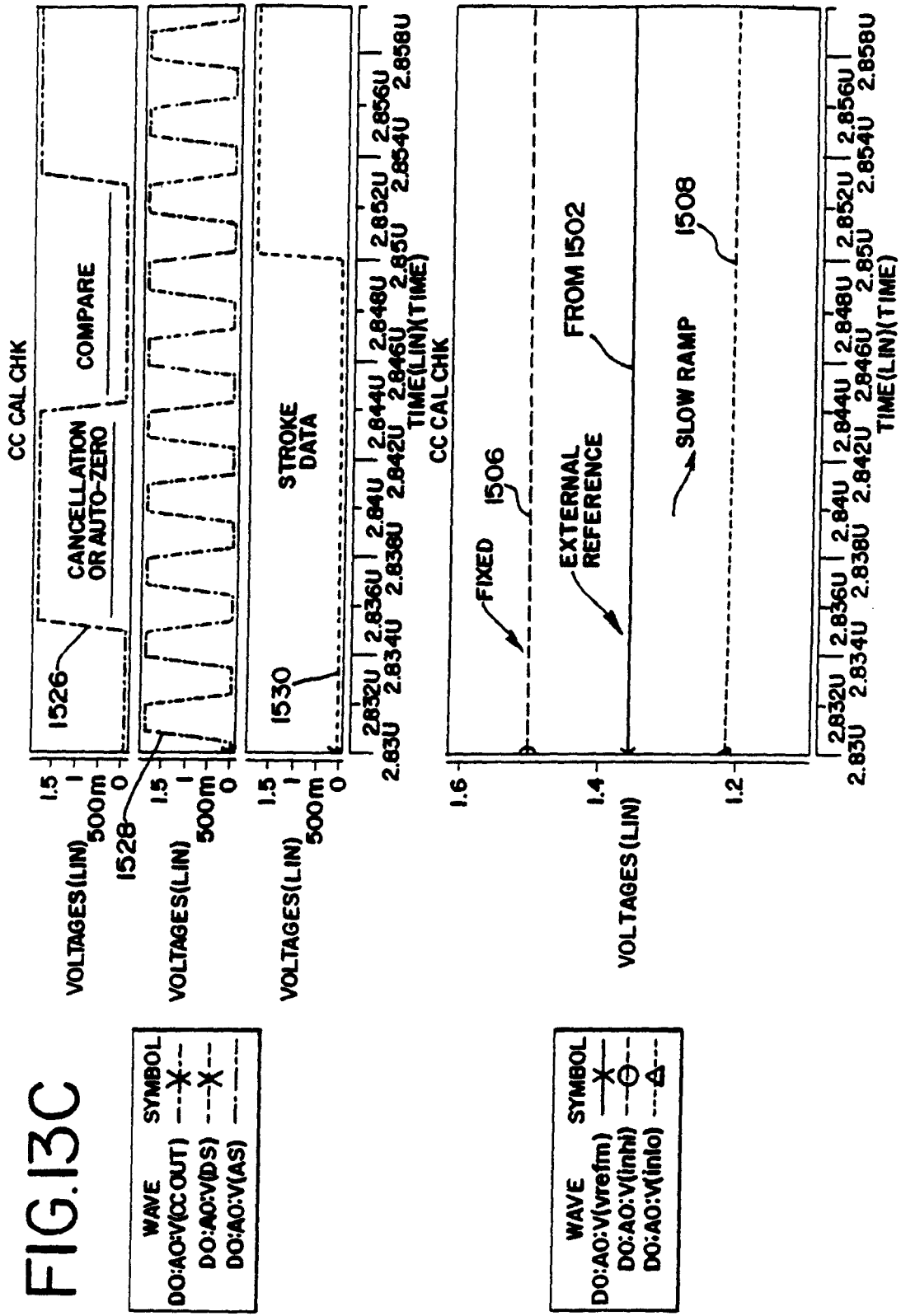
FIG. 13C is a timing diagram for the circuits of FIGS. 13A and 13B.

FIG. 13C is a timing diagram illustrating the relationship between several of the signals referenced above. The timing signals 1526 and 1528 drive the non-overlapping clock driver in FIG. 13A. The auto-zero and compare phases are defined in accordance with the signal 1526. The signal 1530 is the voltage output of the comparator, as shown at pin 1532 in FIG. 13A. The known voltage signal 1506 and the known voltage reference from the multiplexor 1502 are essentially constant. The unknown voltage signal 1508 is adjusted, in this example it is decreasing. When the unknown voltage signal 1508 reaches the point where the reference voltage is equal to the average of the signals 1506 and 1508, the output of the comparator circuit 1530 goes high.

The current control calibration circuit shown in FIGS. 13A and 13B may be utilized as follows to calibrate a 4-PAM output driver, such as the driver of FIG. 5A. When the transistors 1002, 1004 and 1006 are in the "off" state the voltage at the output of the current mode driver is $V_{TERM}$. This corresponds to the symbol 00, which is the zero current state and does not need to be calibrated.

The known voltage, $V_{TERM}$ is applied to line 1506 of the comparator 1500 and an unknown voltage generated by turning "on" the transistor 1002 (from FIG. 5A) is applied to line 1508 of the comparator 1500. The multiplexor 1502 causes the reference voltage, $V_{REFHI}$, to be applied to the comparator 1500. Using feedback from the output of the comparator 1500, a current control transistor (not shown) coupled in series with the transistor 1002 is adjusted until the average of the voltages on lines 1506 and 1508 is equal to the reference voltage, $V_{REFHI}$. The voltage on line 1508 is now calibrated to correspond with the 4-PAM symbol "01".

At this point, the voltage corresponding to the 4-PAM symbol "01" is applied to line 1506, and an unknown voltage generated by turning "on" the transistors 1002 and 1004 is applied to line 1508. The multiplexor 1502 is activated to cause the reference voltage, $V_{REFM}$, to be applied to the comparator 1500. Using feedback from the output of the comparator 1500, a current control transistor (not shown) coupled in series with the transistor 1004 is adjusted until the average of the voltages on lines 1506 and 1508 is equal to the reference voltage, $V_{REFM}$. The voltage on line 1508 is now calibrated to correspond with the 4-PAM symbol "11".

Next, the voltage corresponding to the 4-PAM symbol "11" is applied to line 1506, and an unknown voltage generated by turning "on" the transistors 1002, 1004 and 1006 is applied to line 1508. The multiplexor 1502 is activated to cause the reference voltage, $V_{REFLO}$ to be applied to the comparator 1500. Using feedback from the output of the comparator 1500, a current control transistor (not shown) coupled in series with the transistor 1006 is adjusted until the average of the voltages on lines 1506 and 1508 is equal to the reference voltage, $V_{REFLO}$. The voltage on line 1508 is now calibrated to correspond with the 4-PAM symbol "10".

Those skilled in the art of circuit design will appreciate that the comparator 1500 may take other forms. FIG. 13D illustrates alternative embodiments for the differential comparator of FIG. 13B.

Referring again to FIG. 13B, it will be appreciated that if, for example, the comparator 1500 is implemented as an integrated circuit, then the coupling capacitors 1512 may be implemented using a PMOS FET topology as shown in FIG. 13E. Such capacitors operate linearly when the applied voltage, $V_{DC}$, is greater than the magnitude of the threshold voltage, $V_T$, of the PMOS FET. The averaging and offset cancellation functions of the comparator 1500 are not optimally realized when the capacitors are operated in the non-linear range. It is therefore preferred that the applied voltage be kept within the linear range. In accordance with a preferred embodiment, the applied voltage is within the range of approximately 1.0 volts to 1.8 volts. The auto-zero voltage, $V_{AZ}$, may be approximately 0.6 volts.

Figure 14A:
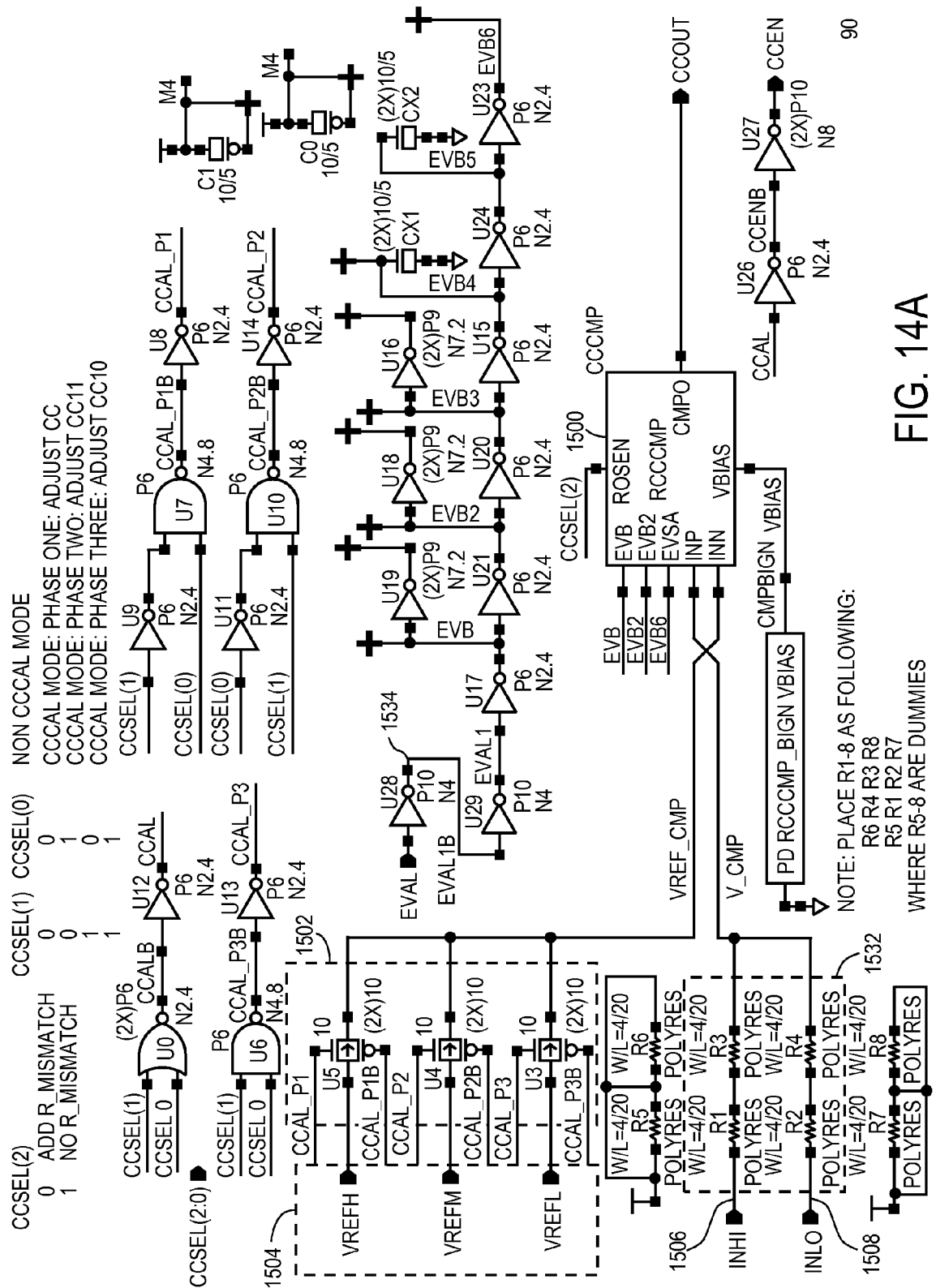
FIGS. 14A and 14B are electrical schematics of a second preferred alternative to the current control calibration circuit of FIG. 10.
Figure 14B:
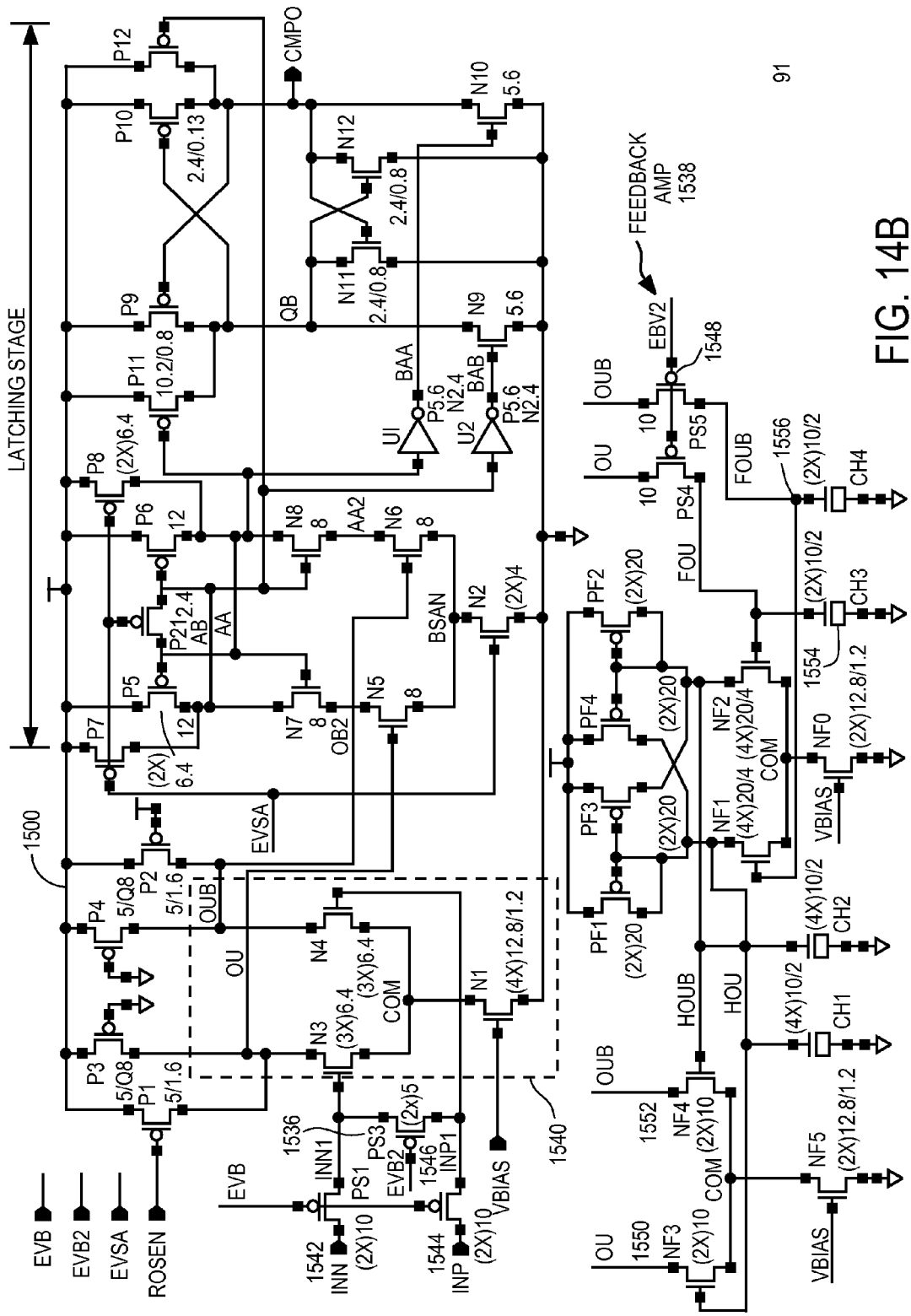

An electrical schematic of another preferred alternative to the current control calibration circuit of FIG. 10 is shown in FIGS. 14A and 14B. As shown in FIG. 14A, this embodiment includes a comparator 1500, a multiplexor 1502, multi-level voltage reference 1504, and source calibration signals 1506 and 1508, which carry a known voltage signal and an unknown (to be calibrated) voltage signal, respectively. In comparison to FIG. 13A, the circuit of FIG. 14A differs in that it includes a resistive voltage combiner 1532 that is coupled to provide the average of the signals on lines 1506 and 1508 to the comparator 1500. In addition, for the embodiment of FIG. 14A, the non-overlapping clock driver is replaced by an inverter delay chain 1534.

As shown in FIG. 14B, the comparator 1500 differs from that of FIG. 13B. Notably, a different offset cancellation technique is utilized. For the embodiment of FIG. 14B, a switch 1536 and feedback amplifier 1538 are used to compensate for the offset voltage associated with a differential amplifier 1540.

The operation of the embodiment shown in FIGS. 14A and 14B will now be described. The timing of the offset cancellation phase and the compare phase are controlled by the inverter delay chain 1534. The inverter delay chain 1534 produces skewed signals evb, evb2, evb6, etc, shown in FIGS.

14C and 14D. The delay between these signals is approximately the delay of one or more logic gates. The delay period may be augmented by loading the gate outputs with additional capacitance.

During the cancellation phase, the feedback amplifier 1538 senses the offset voltage associated with the differential amplifier 1540 as follows. When timing signal evb2 goes low, the inputs 1542 and 1544 of the amplifier 1540 are shorted together by a switch 1546. At the same time, a switch pair 1548 couples the outputs of the amplifier 1540 to the inputs of the feedback amplifier 1538. With the inputs 1542 and 1544 of the amplifier 1540 being shorted together, any voltage appearing at the output of the amplifier 1540 may be characterized as an output offset voltage. The feedback amplifier 1538 produces output current in the drains of transistors 1550 and 1552 in an amount that is proportional to the output offset voltage. The current supplied by the feedback amplifier 1538 works to drive the output offset voltage to zero, thereby balancing the amplifier 1540 when its inputs 1542 and 1544 are shorted. The resultant voltage required to produce the balancing current in the feedback amplifier 1538 is stored on the capacitors 1554 and 1556 at the end of the cancellation phase when the switches 1548 are opened.

Figure 14D:
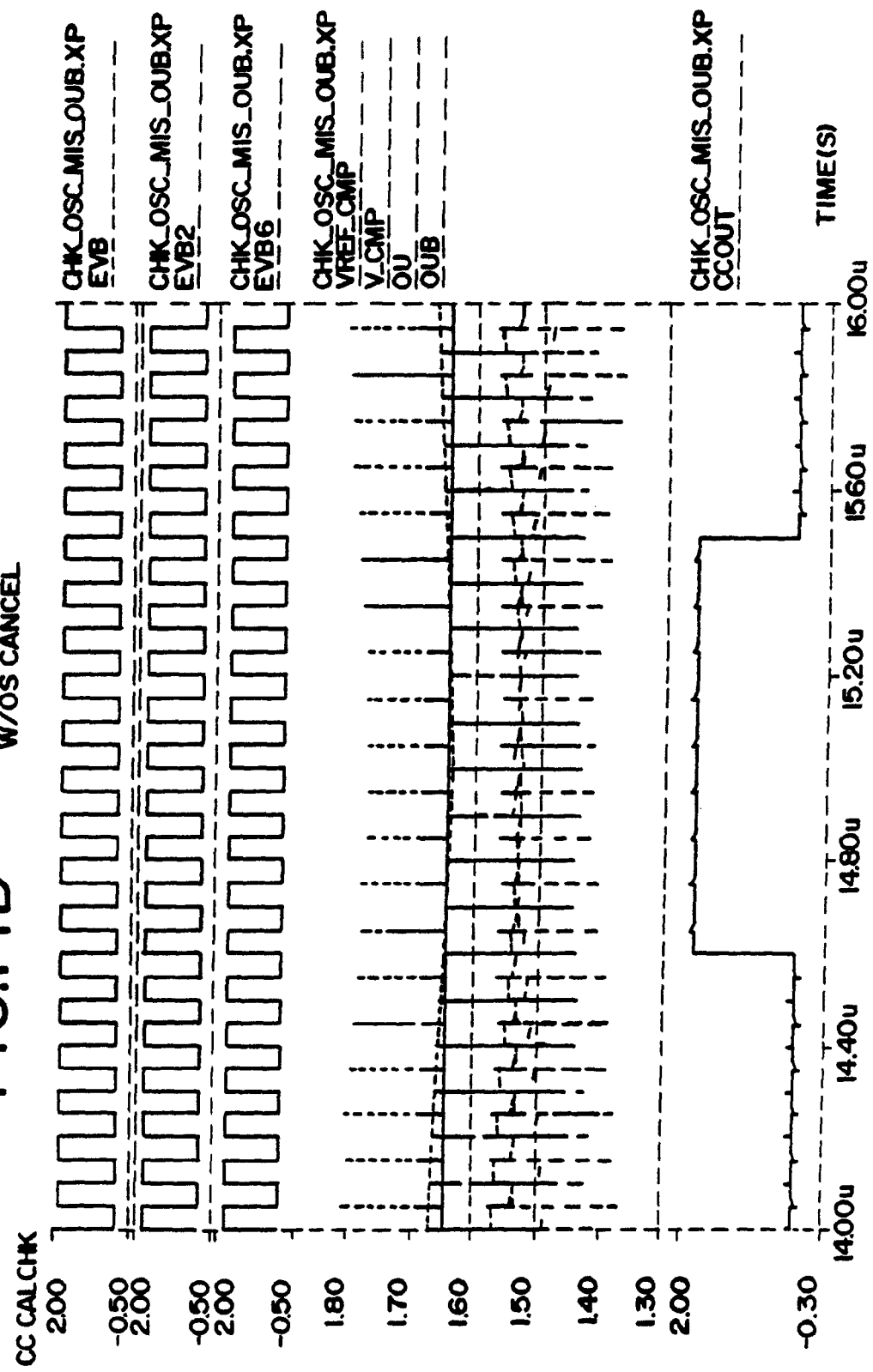

As shown in FIGS. 14C and 14D, shortly after the cancellation phase ends on the falling edge of the signal evb, the switches 1546 and 1548 are opened, disconnecting the feedback amplifier 1538 and coupling the inputs 1542 and 1544 to the amplifier 1540, as the signal evb2 goes high. The transition of evb2 to high starts the compare phase. Momentarily after the compare phase starts, the signal evb6 goes high, activating the latching stage of the comparator 1500. When the latching stage is active, the output voltage of the differential amplifier 1540 is latched.

The current control calibration circuit shown in FIGS. 14A and 14B may be utilized to calibrate a 4-PAM output driver in the same manner as described above with respect to FIGS. 13A and 13B.

Figure 15A:
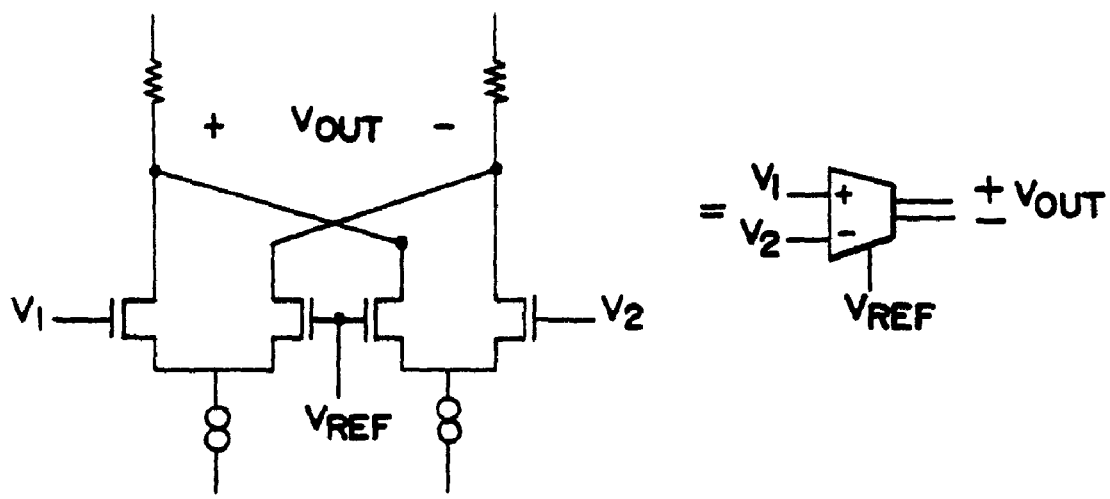
FIG. 15A is an electrical schematic of a linear transconductor.

FIG. 15A is an electrical schematic of a linear transconductor. In a linear region of operation, the output voltage, $V_{OUT}$ is proportional to the difference between the input voltages, $V_1$ and $V_2$. Thus, the output of the linear transconductor is balanced, i.e. $V_{OUT}=0$, when $V_1-V_{REF}=V_{REF}-V_2$, or $(V_1+V_2)/2=V_{REF}$.

Figure 15B:
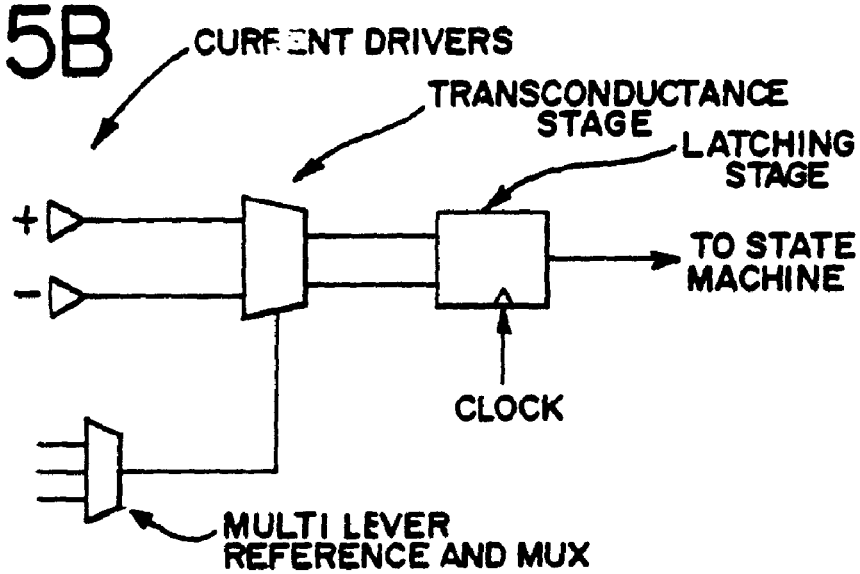
FIG. 15B is a schematic of a comparator using a transconductor stage.

In accordance with yet another alternative embodiment, therefore, the comparator comprises a transconductor stage, as shown in FIG. 15B. For this embodiment, an offset canceling amplifier, such as the amplifier 1538 of FIG. 14B, is preferably utilized.

While the invention has been described in connection with a number of preferred embodiments, the foregoing is not intended to limit the scope of the invention to a particular form, circuit arrangement, or semiconductor topology. To the contrary, the invention is intended to be defined by the appended claims and to include such alternatives, modifications and variations as may be apparent to those skilled in the art upon reading the foregoing detailed description.

What is claimed is:

1. A memory device comprising:
a receiver to receive a first input data signal and to create an output signal corresponding to the first input data signal and a voltage representative of a second signal received earlier in time than the first input data signal.

2. The memory device of claim 1, wherein the voltage is weighted by a control voltage.

3. The memory device of claim 2, further comprising:
a register to store the control voltage.

4. A memory device comprising:
a receiver to receive a first input data signal and to create an output signal corresponding to the first input data signal and a voltage representative of a second input data signal received prior to the first input data signal.

5. The memory device of claim 4, wherein the voltage is weighted by a control voltage.

6. The memory device of claim 5, further comprising:
a register to store the control voltage.

7. A memory system comprising:
a memory controller; and
one or more memory devices, at least one memory device comprising:
a receiver to receive a first input data signal and to create an output signal corresponding to the first input data signal and a voltage representative of a second signal received earlier in time than the first input data signal.

8. The memory system of claim 7, wherein the voltage is weighted by a control voltage.

9. The memory system of claim 8, wherein the at least one memory device further comprises:
a register to store the control voltage.

10. An integrated circuit memory device comprising:
even and odd receivers having respective inputs to receive data bits from adjacent data cycles and respective output nodes; and
an equalization circuit coupled to the respective output nodes to compensate the data bits based on respective values of previously received data bits, wherein previously received data bits having respective values used to compensate respective data bits are received prior to the respective data bits.

* * * * *